US011962220B2

(12) United States Patent
Melo, Jr. et al.

(10) Patent No.: US 11,962,220 B2
(45) Date of Patent: Apr. 16, 2024

(54) SMART-FAN COMPONENTS, CONTROLS AND SYSTEMS

(71) Applicant: Corsair Memory, Inc., Milpitas, CA (US)

(72) Inventors: Manuel Melo, Jr., Alameda, CA (US); Joseph Eamonn L Clerkin, Fremont, CA (US); Justin Osoteo Gavina, Fremont, CA (US); Aaron Joshua Neal, San Ramon, CA (US); Geoffrey Sean Lyon, Alberta (CA)

(73) Assignee: Corsair Memory, Inc., Milpitas, CA (US)

( * ) Notice: Subject to any disclaimer, the term of this patent is extended or adjusted under 35 U.S.C. 154(b) by 189 days.

(21) Appl. No.: 17/547,982

(22) Filed: Dec. 10, 2021

(65) Prior Publication Data

US 2023/0188001 A1    Jun. 15, 2023

(51) Int. Cl.
*H02K 5/22* (2006.01)
*F04D 25/08* (2006.01)
(Continued)

(52) U.S. Cl.
CPC ............ *H02K 5/225* (2013.01); *F04D 25/08* (2013.01); *F04D 25/166* (2013.01);
(Continued)

(58) Field of Classification Search
CPC .......... F04D 25/08; G06F 1/20; H01R 13/02; H01R 13/40
See application file for complete search history.

(56) References Cited

U.S. PATENT DOCUMENTS

| 6,268,664 | B1 * | 7/2001 | Rolls | H05K 7/20581 361/695 |
| 7,675,747 | B1 * | 3/2010 | Ong | H05K 7/20727 361/679.48 |

(Continued)

FOREIGN PATENT DOCUMENTS

DE    102006055411 B4 *  11/2008  ......... B60H 1/00371

OTHER PUBLICATIONS

C. Battenberg et al., "Ventilation, Air Conditioning or / and Heating System With Improved Ventilation Unit", Nov. 20, 2008, DE 10 2006 055 411 B4 document image merged with machine English translation text, pp. 1-12 plus translation text. (Year: 2008).*

*Primary Examiner* — Alan B Cariaso
(74) *Attorney, Agent, or Firm* — Carina M. Tan; Corsair Memory, Inc.

(57) ABSTRACT

A network-controllable cooling fan can have a recessed connector port with an internal tongue that defines an edge connector having a plurality of electrical contacts. The tongue can also define a plurality of electrically conductive tracks that electrically couple with the electrical contacts. Control logic can have a plurality of electrical connections and a logic bus that electrically couples the electrical connections of the control logic with the electrically conductive tracks defined by the tongue. An electrical biscuit-connector with internal electrical interconnections can join the network-controllable cooling fan with another network-controllable cooling fan, extending the logic bus while obscuring the electrical interconnections from a user's view.

26 Claims, 11 Drawing Sheets

(51) Int. Cl.
*F04D 25/16* (2006.01)
*F21V 33/00* (2006.01)
*F21Y 115/10* (2016.01)
*G06F 1/20* (2006.01)
*H01R 13/424* (2006.01)
*H01R 13/502* (2006.01)
*H01R 31/06* (2006.01)
*H02K 11/33* (2016.01)
*H05K 7/20* (2006.01)

(52) U.S. Cl.
CPC ............ *F21V 33/0096* (2013.01); *G06F 1/20* (2013.01); *H01R 13/424* (2013.01); *H01R 13/502* (2013.01); *H01R 31/06* (2013.01); *H02K 11/33* (2016.01); *H05K 7/20136* (2013.01); *F21Y 2115/10* (2016.08)

(56) References Cited

U.S. PATENT DOCUMENTS

| | | | | |
|---|---|---|---|---|
| 9,477,438 | B1 * | 10/2016 | Hochman | H01R 13/665 |
| 10,690,336 | B1 * | 6/2020 | Chen | G06F 1/20 |
| 2005/0135060 | A1 * | 6/2005 | Cote | G11B 33/127 |
| 2017/0086332 | A1 * | 3/2017 | Jaskela | H05K 7/1487 |
| 2019/0021185 | A1 * | 1/2019 | Ju | H01R 13/502 |
| 2020/0388970 | A1 * | 12/2020 | Tsai | H01R 13/6581 |

* cited by examiner

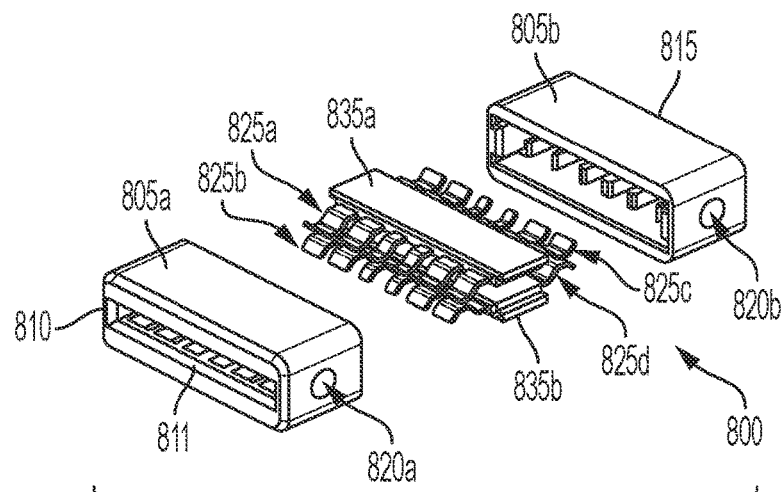
FIG. 7
FIG. 8
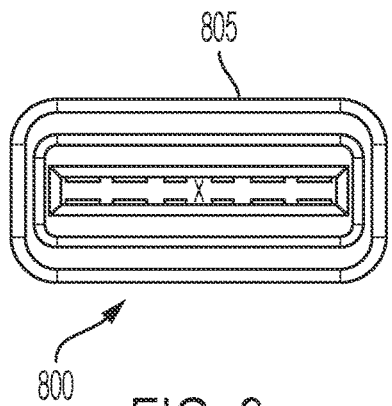
FIG. 9
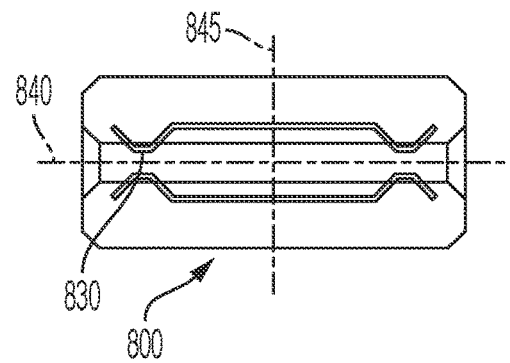
FIG. 10
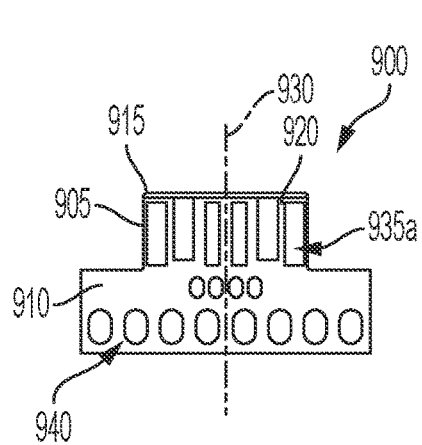
FIG. 11A
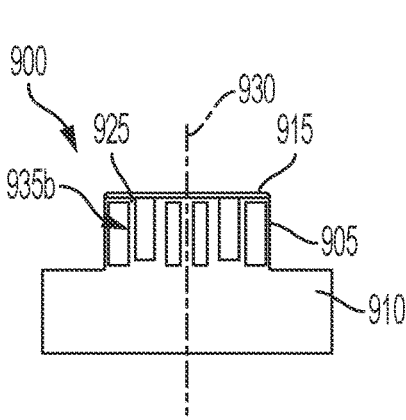
FIG. 11B
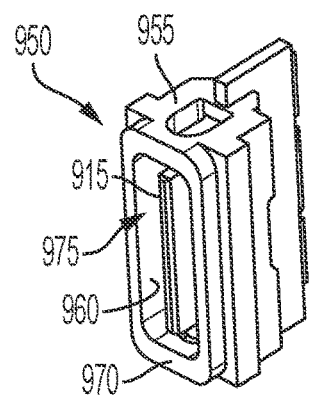
FIG. 12

SMART-FAN COMPONENTS, CONTROLS AND SYSTEMS

FIELD

This application and the subject matter disclosed herein (collectively referred to as the "disclosure"), generally concern network-controllable cooling fans and accessories, and related aspects of communication networks (e.g., busses, connectors, and communication protocols), and related systems and methods. More particularly, but not exclusively, this disclosure pertains to systems, methods, and components relating to a bank (or an array) of network-controllable cooling fans, with an innovative biscuit-connector being but one disclosed aspect.

BACKGROUND INFORMATION

Computer systems need to dissipate heat generated by electronic components to maintain component temperatures at or below selected threshold temperatures, beyond which component reliability suffers. However, as each successive generation of computer processor increases in computing performance, the rate of heat generation also increases. Whereas recent-past generations of microprocessors (CPUs) for desktop computers generated on the order of 100 W of heat, next generation CPUs are anticipated to generate nearly 300 W. Further, current generations of graphics processors (GPUs) generate about 450 W and next generation GPUs are anticipated to generate 600 W.

With these ever-increasing rates of heat generation by temperature-sensitive electronic components, approaches for dissipating or rejecting the waste heat from computers have evolved. For example, past-generations of desktop computers included a fan to exhaust heated air from the computer while drawing fresh, cool air into the computer. And, as rates of heat generation have increased with increasing processor performance, computer enclosures have incorporated additional fans to displace heated air in the computer with fresh, cool air from outside the computer more efficiently.

In parallel with this trend of increasing cooling demands, computer enthusiasts have elected to decorate their computer systems with accessory lighting, e.g., LED-based lighting systems. With seemingly ever-increasing numbers of system fans and decorative lighting systems, managing electrical cabling (e.g., power cords and data cables) in an efficient and aesthetically pleasing manner has become increasingly difficult.

SUMMARY

In some respects, concepts disclosed herein generally concern network-controllable cooling fans and accessories, as well as related aspects of controllers and communication networks. For example, some disclosed concepts pertain to systems, methods, and components for installing and operating a selected plurality of fans in a computer system in a manner that reduces or eliminates electrical cabling (and thus reduces or eliminates visual clutter) compared to prior approaches. And, some concepts enable additional functionality while also reducing or eliminating cabling and other components that previously required substantial labor to install in an orderly manner. As but one example, an electrical biscuit-connector can electrically couple a fan and its lighting components to a control system, as well as physically couple the fan's housing with another fan housing (e.g., to form an array of fans, or a "fan bank) in a manner that obscures the electrical cabling and physical joinery from view.

According to a first aspect, a logic hub includes a substrate, a logic component mounted to the substrate, and a housing enclosure. The substrate defines a major region and a tongue extending outward of the major region. The tongue defines a first major surface and a second major surface oriented opposite the first major surface. The substrate also defines a peripheral edge having a segment extending around the tongue from the first major surface to the second major surface. The tongue defines an edge connector having a first plurality of electrical contacts exposed to the first major surface and a second plurality of electrical contacts exposed to the second major surface. The substrate also includes a plurality of electrically conductive tracks. Each of the plurality of electrically conductive tracks electrically couples with one of the electrical contacts exposed on the first major surface and a corresponding one of the electrical contacts exposed on the second major surface.

The logic component has a plurality of electrical connections. Each in the plurality of electrical connections is electrically coupled with at least one of the plurality of electrically conductive tracks, electrically coupling each of the plurality of electrical connections of the logic component with one of the electrical contacts exposed to the first major surface of the tongue and one of the electrical contacts exposed to the second major surface of the tongue.

The housing enclosure has a peripheral wall positioned outwardly of the peripheral edge of the substrate. The peripheral wall defines an outer surface. The housing enclosure further includes a connector housing defining a wall recessed from the outer surface of the peripheral wall and extending around a portion of the tongue of the substrate to define a gap around the tongue between the recessed wall and the tongue.

The arrangement of the first plurality of electrical contacts can be 180-degrees-symmetric with the arrangement of the second plurality of electrical contacts.

The plurality of electrical contacts exposed on the first major surface can include a power contact, a ground contact, a first data contact and a second data contact.

The recessed wall of the connector housing can include a detent portion. The detent portion can include one or more of: a recessed region, a resiliently mounted catch extending into the gap around the tongue, and a set screw.

The logic component can include a controller for controlling a plurality of fans and a plurality of accessories. For example, the plurality of accessories can include a lighting element corresponding to each in the plurality of fans. In an embodiment, the controller is configured to control each of the plurality of fans independently of each other. In another embodiment, the controller is configured to control each of the plurality of fans in concert with each other. In some embodiments, the controller is configured to control each of the accessories independently of each other. For example, in some embodiments, the controller is configured to control each of the accessories independently of control of the plurality of fans. In some embodiments, the controller is configured to control the plurality of accessories in concert with control of the plurality of fans.

The plurality of electrically conductive tracks can include a power track, a ground track, a first data track and a second data track. The logic component can include a processor and a memory containing instructions. When executed by the processor, the instructions can cause the logic component to receive an independently addressed data signal corresponding to each fan of the plurality of fans over the first data track and to transmit an independently addressed control signal to each fan of the plurality of fans over the second data track.

According to another aspect, an electrical biscuit-connector includes a housing enclosure extending from a first end to a second end. The first end of the housing enclosure defines a first recessed opening, and the second end of the housing enclosure defines a second recessed opening. The housing enclosure further defines an external surface having a first detent region positioned proximate the first end and a second detent region positioned proximate the second end. Each of the first detent region and the second detent region is configured to mechanically catch a corresponding detent region of another device.

The electrical biscuit-connector also includes a first plurality of cantilevered arms arranged opposite a corresponding second plurality of cantilevered arms. The first and second pluralities of cantilevered arms are positioned within the first recessed opening of the housing enclosure. Each of the cantilevered arms in the first plurality of cantilevered arms and the second plurality of cantilevered arms defines an electrical-contact region.

The electrical biscuit-connector also includes a third plurality of cantilevered arms arranged opposite a corresponding fourth plurality of cantilevered arms. The third and fourth pluralities of cantilevered arms are positioned within the second recessed opening of the housing enclosure. Each of the cantilevered arms in the third plurality of cantilevered arms and the fourth plurality of cantilevered arms defines an electrical-contact region. Each of the cantilevered arms in the first plurality of cantilevered arms is electrically coupled with a corresponding one of the cantilevered arms in the third plurality of cantilevered arms and each of the cantilevered arms in the second plurality of cantilevered arms is electrically coupled with a corresponding one of the cantilevered arms in the fourth plurality of cantilevered arms.

In some embodiments, each cantilevered arm in the first plurality of cantilevered arms is monolithic and continuous with the corresponding one of the cantilevered arms in the third plurality of cantilevered arms.

Each cantilevered arm in the second plurality of cantilevered arms can be monolithic and continuous with the corresponding one of the cantilevered arms in the fourth plurality of cantilevered arms.

A first retainer can be configured to retain the first plurality of cantilevered arms in a fixed position relative to the third plurality of cantilevered arms.

A second retainer can be configured to retain the second plurality of cantilevered arms in a fixed position relative to the fourth plurality of cantilevered arms.

In an embodiment, the housing enclosure comprises a first shell and a second shell. By way of example, the first shell can define the first end, the first recessed opening, and the first detent region of the housing enclosure. By way of further example, the second shell can define the second end, the second recessed opening, and the second detent region of the housing enclosure.

In some embodiments, the first shell extends from the first end of the housing enclosure to a first intermediate end. In some embodiments, the second shell extends from the second end of the housing enclosure to a second intermediate end. In some embodiments, the first intermediate end and the second intermediate end are positioned adjacent each other. For example, in some embodiments, the first intermediate end and the second intermediate end abut each other. The first intermediate end and the second intermediate end can matingly engage with each other or be fused together.

The first recessed opening can define a first interior wall and a second interior wall. The first recessed opening can be so sized relative to the first plurality of cantilevered arms and the second plurality of cantilevered arms as to define, when the biscuit-connector is disengaged from an edge connector of an interconnect substrate, a first gap between each of the first plurality of cantilevered arms and the first interior wall and a second gap between each of the second plurality of cantilevered arms and the second interior wall. The first recessed opening can be so sized relative to the first plurality of cantilevered arms and the second plurality of cantilevered arms as to define, when the biscuit-connector is engaged with an edge connector of an interconnect substrate, to cause the first plurality of cantilevered arms to urge against the first interior wall and to cause the second plurality of cantilevered arms to urge against the second interior wall.

The first retainer and the second retainer can be positioned opposite each other, positioning the first plurality of cantilevered arms opposite the second plurality of cantilevered arms.

The first shell can extend around a first portion of the first retainer and a corresponding first portion of the second retainer, urging the first retainer and the second retainer together.

The second shell can extend around a second portion of the first retainer and a corresponding second portion of the second retainer, urging the first retainer and the second retainer together.

According to another aspect, a smart-fan apparatus includes a fan rotor defining an axis-of-rotation and having a hub and a plurality of airfoils. Each in the plurality of airfoils extends radially outward from the hub. The fan rotor defines an outer circumference-of-rotation. The smart-fan apparatus also includes an electric motor that has a rotor configured to urge the fan rotor in rotation about the axis-of-rotation. A housing defines a duct region for receiving the fan rotor. The duct region is coaxially aligned with and extends longitudinally of the axis-of-rotation from a first face to a second face. The rotor is positioned within the duct region, and the duct region is so sized relative to the outer circumference-of-rotation as to define a gap between the fan rotor and the duct. The housing further defines a sidewall extending longitudinally of the axis-of-rotation from the first face to the second face. The sidewall has an outer surface.

The smart-fan apparatus also includes a connector port recessed from the outer surface of the sidewall. The connector port has an internal tongue defining a first major surface and an opposed second major surface. The tongue defines an edge connector having a first plurality of electrical contacts exposed on the first major surface and a second plurality of electrical contacts exposed on the second major surface. The tongue also includes a plurality of electrically conductive tracks. Each of the plurality of electrically conductive tracks is electrically coupled with one of the electrical contacts exposed on the first major surface and a corresponding one of the electrical contacts exposed on the second major surface.

The smart-fan apparatus also includes control logic having a plurality of electrical connections. A logic bus electrically couples each of the plurality of electrical connections with at least one of the plurality of electrically conductive tracks, electrically coupling each of the plurality of electrical connections of the logic component with one of the electrical contacts exposed on the first major surface of the tongue and one of the electrical contacts exposed on the second major surface of the tongue.

In an embodiment, the control logic comprises a processor and a memory containing instructions that when executed by the processor, cause the control logic to control a speed of the electric motor.

The control logic can include a logic bus, and the first plurality of electrical connections can include a first transmission line and a second transmission line. The first transmission line electrically can be electrically coupled with a first one of the plurality of electrically conductive tracks and the second transmission line can be electrically coupled with a second one of the plurality of electrically conductive tracks.

The control logic can include a microcontroller and a drop connection to the microcontroller from the first transmission line, the second transmission line, or both.

In an embodiment, the connector port is a first connector port and the smart-fan apparatus further includes a second a connector port recessed from the outer surface of the sidewall at a position opposite the first connector port relative to the fan rotor.

The second connector port can have an internal tongue defining a first major surface and an opposed second major surface. The tongue can define an edge connector having a first plurality of electrical contacts exposed on the first major surface of the tongue and a second plurality of electrical contacts exposed on the second major surface of the tongue. Each of the exposed electrical contacts of the second connector port can electrically couple to a corresponding one of the exposed electrical contacts of the first connector port.

In some embodiments, the control logic includes a logic bus having a first transmission line and a second transmission line. The first transmission line can electrically couple one of the electrical contacts of the second connector port with the corresponding one of the exposed electrical contacts of the first connector port. The second transmission line can electrically couple another one of the electrical contacts of the second connector port with the corresponding one of the exposed electrical contacts of the first connector port.

In some smart-fan embodiments, the control logic also includes a microcontroller and a drop connection to the microcontroller from the first transmission line, the second transmission line, or both.

The microcontroller can have an output connection electrically coupled with the motor, as for communicating a signal to the motor to control a speed of the motor. In some embodiments, the microcontroller is configured to output a pulse-width modulated signal over the output connection coupled with the motor.

In some embodiments, a smart-fan apparatus can include a controllable accessory. The output connection can be a first output connection and the microcontroller can have a second output connection electrically coupled with the controllable accessory to communicate a signal to the controllable accessory. The signal can control operation of the controllable accessory.

In some embodiments, the controllable accessory includes accessory lighting having a plurality of illuminable-elements. By way of example, the microcontroller can be configured to control one or more of illumination status, brightness, and/or color of each illuminable-element of the accessory lighting independently of each other illuminable-element of the accessory lighting.

In some embodiments, the fan rotor is a first fan rotor, the electric motor is a first electric motor, the housing is a first housing, and the connector port is a first connector port. In such embodiments, the smart-fan apparatus can also include a second fan rotor, a second electric motor, a second housing and a second connector port. For example, the second fan rotor can have a hub and a plurality of airfoils and the second electric motor can be configured to urge the second fan rotor in rotation. The second fan rotor can be rotatably coupled within the second housing, and the second housing can define a sidewall having an outer surface. The second connector port can be recessed from the outer surface of the second housing's sidewall. The second connector port can have an internal tongue defining a first major surface and an opposed second major surface. The internal tongue can define an edge connector having a first plurality of electrical contacts exposed on the first major surface and a second plurality of electrical contacts exposed on the second major surface. The smart-fan apparatus can also include a biscuit-connector having a first end defining an outer contour complementary with the recess of the first connector port. The biscuit-connector can include a first plurality of internal connector pins complementarily arranged relative to the exposed contacts of the first connector port so as to urge against the exposed contacts of the first connector port when the first end of the biscuit-connector matingly engages with the first connector port. Further, the biscuit-connector can have a second end defining an outer contour complementary with the recess of the second connector port. The biscuit-connector can include a second plurality of internal connector pins complementarily arranged relative to the exposed contacts of the second biscuit-connector port so as to urge against the exposed contacts of the second connector port when the second end of the biscuit-connector matingly engages with the second connector port.

In some embodiments, the first end of the biscuit-connector can matingly engage with the first connector port and the second end of the biscuit-connector can matingly engage with the second connector port. The smart-fan apparatus can also include a first detent for retaining the first end of the biscuit-connector in the first connector port and a second detent for retaining the second end of the biscuit-connector in the second connector port.

In some embodiments, the biscuit-connector can matingly engage with the first connector port and the second connector port so the sidewall of the first housing mates with the sidewall of the second housing.

The control logic can be a first control logic and the smart-fan apparatus can also include a second control logic having a second plurality of electrical connections. Each in the second plurality of electrical connections can electrically couple with one of the first plurality of electrical contacts and a corresponding one of the second plurality of electrical contacts of the second connector port.

According to yet another aspect, a smart-fan apparatus includes a fan rotor, an electric motor and a housing. The fan rotor can define an axis-of-rotation and have a hub. A plurality of airfoils extends radially outward from the hub and the fan rotor defines an outer circumference-of-rotation. The electric motor can have a rotor configured to urge the fan rotor in rotation about the axis-of-rotation. The housing defines a duct region for receiving the fan rotor. The duct region is coaxially aligned with and extends longitudinally of the axis-of-rotation from a first face to a second face. The rotor is positioned within the duct region, and the duct region is sized relative to the outer circumference-of-rotation as to define a gap between the fan rotor and the duct. The housing further defines a sidewall extending longitudinally of the axis-of-rotation from the first face to the second face. The sidewall has an outer surface. The smart-fan apparatus also has an interconnect substrate defining a hub and a plurality of struts extending outwardly of the hub and spanning across the duct region of the housing. The interconnect substrate further defines a plurality of electrical tracks. Each electrical track electrically couples at least one region of the interconnect substrate with another region of the interconnect substrate. The electric motor is mounted to the hub of the interconnect substrate. Control logic is configured to control a speed of the electric motor.

The smart-fan apparatus can also include an illuminable element mounted to at least one of the plurality of struts defined by the interconnect substrate. In some embodiments, the control logic can be configured to control the illuminable element.

In some embodiments, the interconnect substrate is a first interconnect substrate and the smart-fan apparatus can further include a second interconnect substrate. An illuminable element can be mounted to the second interconnect substrate, and the control logic can be further configured to control the illuminable element mounted to the second interconnect substrate.

The first interconnect substrate and the second interconnect substrate can be electrically coupled with each other. In some embodiments, the control logic includes a microcontroller mounted to the first interconnect substrate and electrically coupled with the illuminable element mounted to the second interconnect substrate.

Also disclosed are associated methods, as well as tangible, non-transitory computer-readable media including computer executable instructions that, when executed, cause a computing environment to implement one or more methods disclosed herein. Digital signal processors embodied in software, firmware, or hardware and being suitable for implementing such instructions also are disclosed.

The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

FIG. 7 shows an embodiment of a connector pinout.

FIG. 8 shows an exploded view of an electrical biscuit-connector.

FIG. 9 shows an end-elevation view of the electrical biscuit-connector shown in FIG. 8.

FIG. 10 shows a cross-sectional, side-elevation view of the electrical biscuit-connector shown in FIG. 8.

FIG. 11A shows a first major surface of an interconnect substrate defining an edge connector compatible with the electrical biscuit-connector shown in FIG. 8. FIG. 11B shows a second major surface of the interconnect substrate shown in FIG. 11A.

FIG. 12 shows a connector socket compatible with the edge connector shown in FIG. 11 and the electrical biscuit-connector shown in FIG. 8.

DETAILED DESCRIPTION

Figure 1:
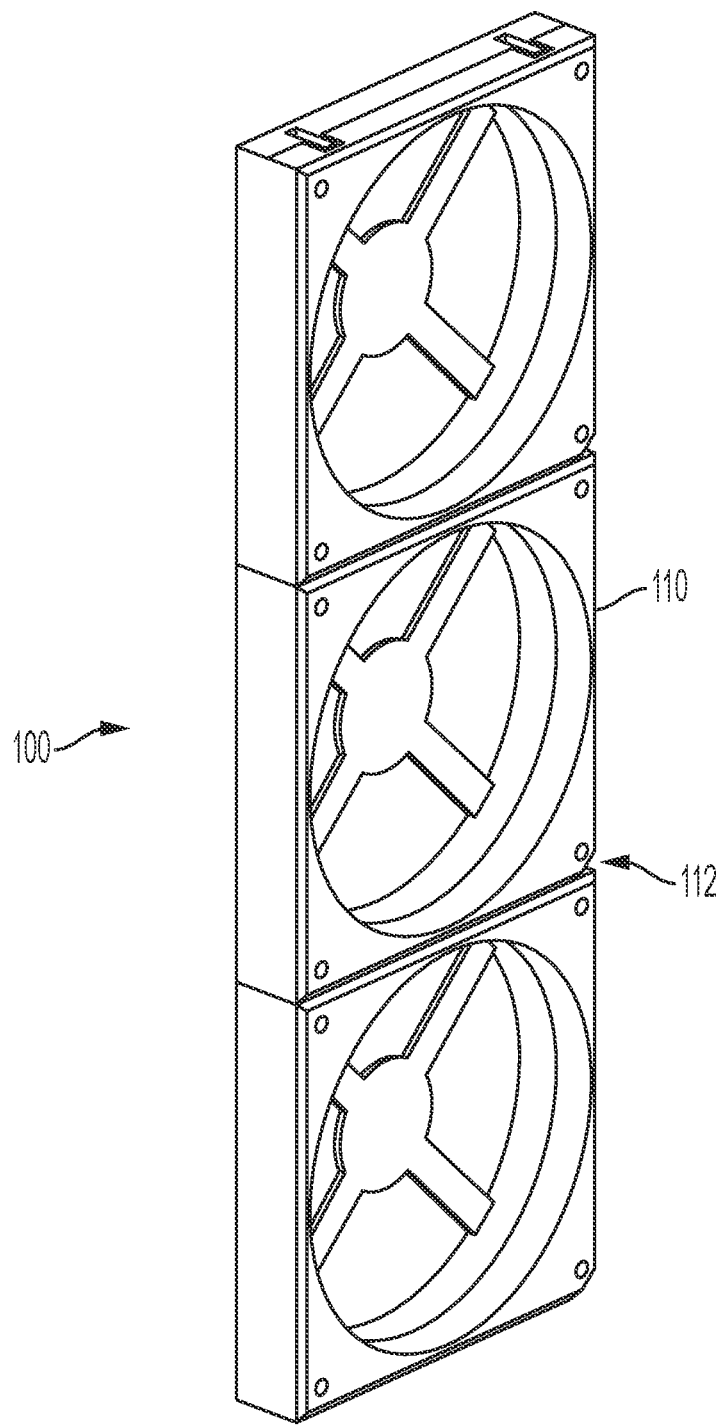
FIG. 1 illustrates a bank of daisy-chained smart fans, with each fan electrically coupled to a logic bus in parallel with each of the other fans.

The following describes various principles related to network-controllable cooling fans and accessories. For example, certain aspects of disclosed principles pertain to communication networks (e.g., busses, connectors, and communication protocols), and related systems and methods. Other aspects pertain to systems, methods, and components relating to a bank (or an array) of network-controllable cooling fans, with an innovative biscuit-connector being but one disclosed aspect. That said, descriptions herein of specific apparatus configurations and combinations of method acts are but particular examples of contemplated systems chosen as being convenient illustrative examples of disclosed principles. One or more of the disclosed principles can be incorporated in various other systems to achieve any of a variety of corresponding system characteristics.

Thus, systems having attributes that are different from those specific examples discussed herein can embody one or more presently disclosed principles, and can be used in applications not described herein in detail. Accordingly, such alternative embodiments also fall within the scope of this disclosure.

I. Overview

Unlike conventional hub-and-spoke cabling for fans and other accessories (e.g., decorative lighting) that leads to complex cable-management problems, embodiments of disclosed principles reduce the number of conventional cables or altogether eliminate them. Moreover, disclosed principles deliver enhanced control of fans and accessories, particularly when a plurality of fans are mounted together to form a bank (or array) of fans, as shown by way of example in FIG. 1. Further, embodiments of some disclosed principles can acquire sensor data and other information that controllers can use to inform operation of cooling fans and accessories.

In some respects, disclosed principles provide a multipoint differential bus that allows bi-directional communication between any two selected nodes connected to the bus. As discussed more fully below, TIA/EIA-485 (RS-485) is a popular electrical standard describing an exemplary embodiment of such a bus. Aspects of disclosed logic busses are described throughout and by way of example with reference to FIGS. 2 through 5. In some respects, an innovative electrical biscuit-connector can couple another bus segment to a pre-existing bus, physically expanding the bus, for example, to add to the number of fans and/or accessories electrically coupled to the bus. Embodiments of such connectors are illustrated by way of example in FIGS. 6 through 18. In other respects, the innovative electrical biscuit-connector structurally supports the added fans and/or accessories, as by physically coupling or tying them together. In other respects, a physical biscuit-connector (e.g., a biscuit-connector having substantially similar or identical physical dimensions as the electrical biscuit-connector, but lacking the electrical contacts and tracks of the electrical biscuit-connector) can physically couple one fan to another fan, as shown for example in FIGS. 6 and 20.

Figure 17:
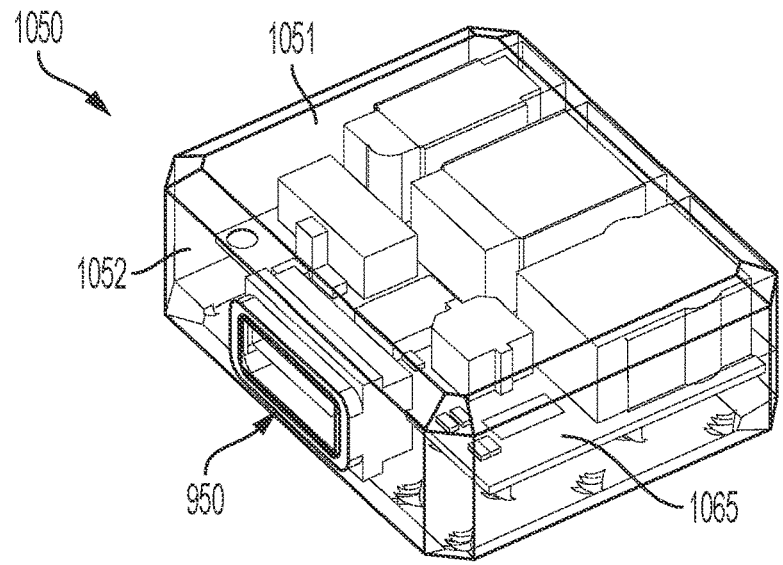
FIG. 17 shows aspects of a logic hub having one socket and edge connector as shown in FIGS. 11 and 12.
Figure 18:
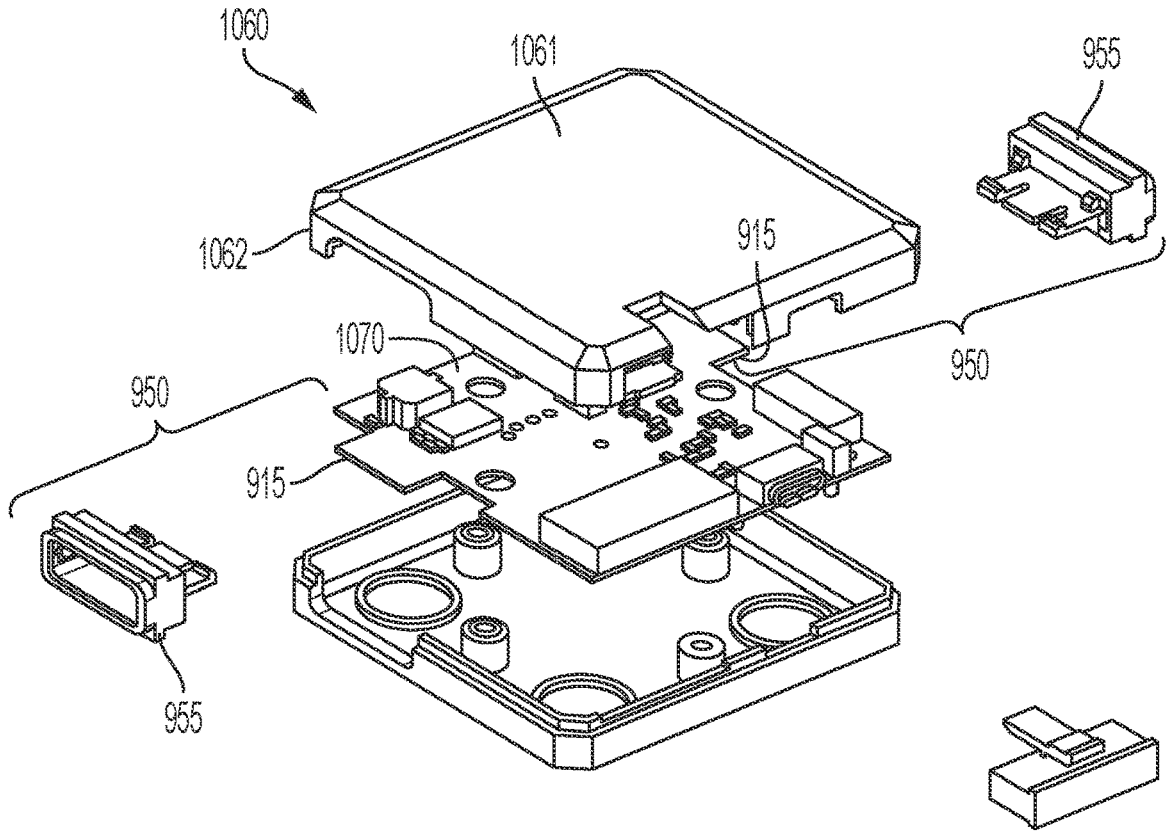
FIG. 18 shows an exploded view of an alternative logic hub having two connector socket-and-edge connectors as shown in FIGS. 11 and 12.

In other respects, disclosed principles provide smart fans with independently addressable and controllable logic. For example, referring to FIG. 1, each fan 110 in a plurality of smart fans (or a bank of smart fans 100) can be physically and electrically coupled with each other in a manner that extends a logic bus 112 (not shown in FIG. 1) from one smart fan 110 to a next smart fan 110 (e.g., conceptually similar to "daisy-chaining" components together). Despite such a serial connection, each smart fan can have a microcontroller (or other control logic) electrically coupled to the logic bus in parallel relative to the microcontroller (or other control logic) of the "upstream" smart fan 110. Further, the control logic for each smart fan 110 can be independently addressed, allowing each smart fan 110 to be controlled independently of each other smart fan 110 in or among a bank of smart fans 100. In addition to controlling, for example, fan speed, the microcontroller (or other control logic) of the smart fan 110 can control a fan accessory (e.g., lighting). Further, the microcontroller (or other control logic) can gather sensor data (e.g., fan speed, air temperature, air pressure, dew point, etc.) from one or more sensors associated with (e.g., mounted on) each respective smart fan 110 and communicate a digital signal over the logic bus 112 to, e.g., a control hub. Embodiments of exemplary control hubs are shown in FIGS. 17 and 18.

Figure 20:
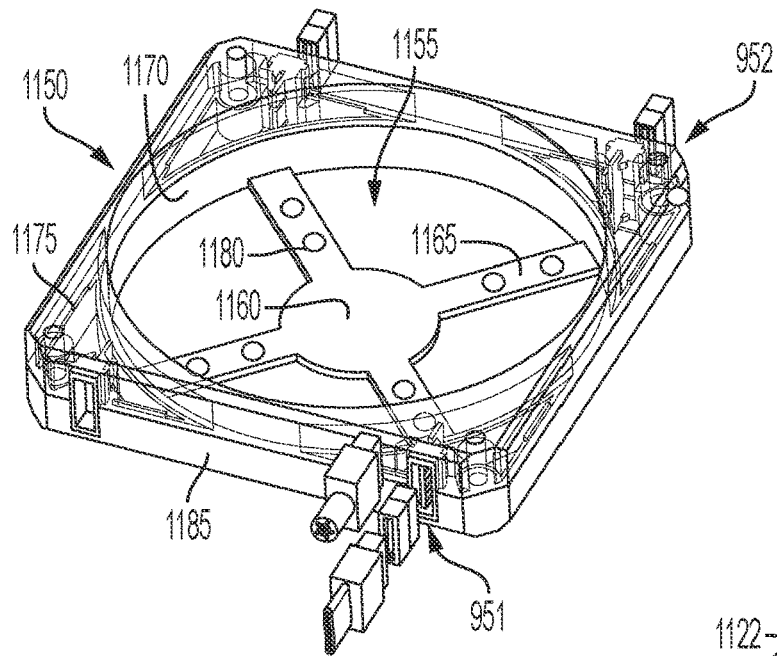
FIG. 20 shows aspects of an alternative fan embodiment that substitutes a electrical interconnect for the hub and struts of the fan housing in FIG. 19.
Figure 21:
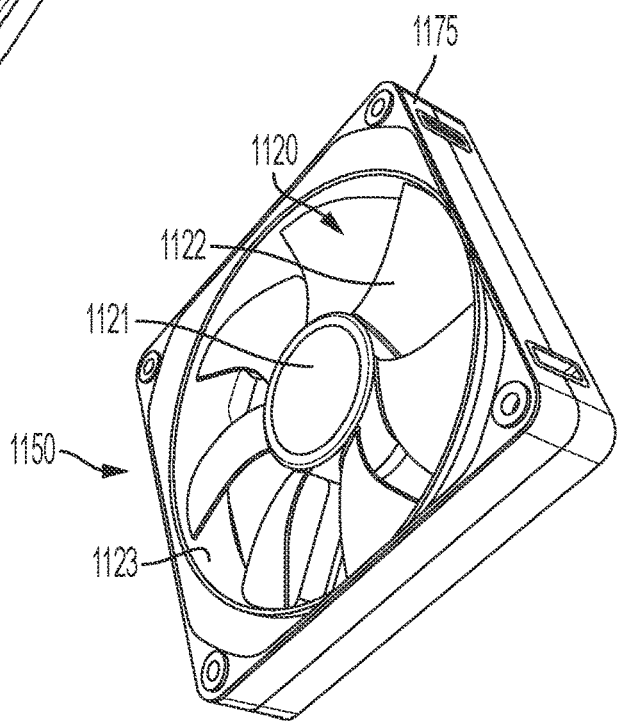
FIG. 21 shows the fan embodiment in FIG. 20 with a rotor installed.

In still other respects, conventional fan-housing struts that extend across a face of the fan can be replaced by an interconnect substrate. For example, an interconnect substrate can define a hub and a plurality of struts extending outward of the hub across a face of the fan. The fan motor can be mounted to the hub and, optionally, one or more illuminable elements can be mounted to each strut (or any of them). With such an arrangement, the overall fan thickness can be decreased, or the airfoils of the fan rotor can be made to extend axially deeper than conventional fans. With such axially deeper airfoils, the fan rotor can urge a higher volumetric (or mass) flow rate of air through the fan at a given rotational speed. Exemplary embodiments of such fans are shown in FIGS. 20 and 21.

The principles disclosed herein overcome many problems in the prior art and/or address one or more of the aforementioned or other needs. Further details of disclosed principles are set forth below. Section II describes principles pertaining to disclosed logic busses. Section III describes principles pertaining to electrical connectors suitable for use with such logic busses, and Section IV describes principles relating to smart-fan components with reduced axial dimensions. And, Section V discloses principles related to computing environments and other logic suitable for implementing disclosed control and data acquisition technologies.

II. Logic Busses

The following describes embodiments of a logic bus suitable for controlling each fan among a bank of fans 100, as shown by way of example in FIG. 1. Such logic busses can also (or alternatively) control other accessories (e.g., visual accessories such as, for example, LED lighting, whether mounted to a fan, mounted elsewhere in a computer, or mounted externally of the computer).

TIA/EIA-485 (sometimes also referred to in the art as "RS-485") is an electrical standard for interchanging data between or among individual devices (sometimes also referred to as "nodes"). The TIA/EIA-485 standard, in particular, relies on a multipoint, differential-bus architecture.

As used herein, the term "multipoint-bus" refers to an interconnection medium shared between or among a plurality of devices (or "nodes" or "stations") that provides a communication connection between or among any selected nodes of the plurality of devices. For example, a multi-point bus can provide three or more nodes connected to a common transmission media with the necessary links to communicate data between any selected two nodes. As used herein, a "differential bus" means an interconnection medium that provides for differential signaling.

As used herein, "differential signaling" means an approach for transmitting information or data using a complementary pair of signals. Each in the pair of complementary signals carries the same information and travels on its own electrical conductor (e.g., using a twisted pair of wires, a ribbon cable, or tracks on an interconnect substrate). Electrically, each conductor carries a voltage that is equal in magnitude to that carried by the other conductor but opposite in polarity. A receiver responds to a voltage difference between the complementary signals, which provides a signal having a magnitude twice as large as that of each individual signal, providing a higher signal-to-noise ratio than a single-ended signal. Moreover, radiated emissions from one conductor tend to cancel radiated emissions from the other conductor, reducing interference to signals carried by nearby transmission lines.

Signals can be communicated bidirectionally over a multipoint, differential bus using a full-duplex protocol or a half-duplex protocol. A full-duplex protocol allows transmission and reception of data (e.g., over separate channels, or transmission lines) to occur concurrently. An example of a multipoint, differential bus capable of full-duplex communication is shown by way of example in FIG. 2.

Figure 2:
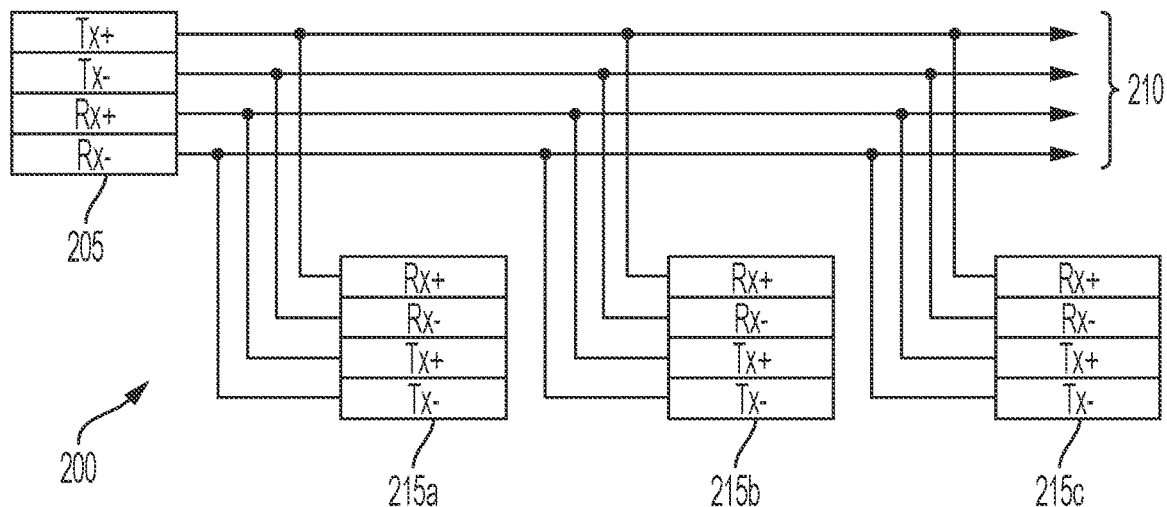
FIG. 2 schematically illustrates aspects of a multi-point, differential logic bus suitable for full duplex communication between and among a plurality of nodes.

In FIG. 2, an embodiment of a multipoint, differential bus 200 capable of full-duplex communication is shown. Signal connections 205 for a primary device (e.g., a microcontroller) are shown to the left of FIG. 2 and the transmission lines of the logic bus 210 extend to the right. Several nodes 215a-c are shown coupled to the logic bus 210 in parallel with each other. For example, the Tx+ and the Tx− outputs from the primary device/microcontroller 205 are electrically coupled with the Rx+ and Rx− inputs, respectively, of each secondary device 215a-c. Accordingly, a differential signal output over the Tx+ and Tx− outputs of the microcontroller 205 is received at the Rx+ and Rx− inputs, respectively, of each secondary device 215a-c.

Conversely, the Rx+ and the Rx− inputs to the microcontroller 205 are electrically coupled with the Tx+ and Tx− outputs, respectively, of each secondary device 215a-c. Accordingly, a differential signal output over the Tx+ and Tx− outputs of each secondary device 215a-c is received at the Rx+ and Rx− inputs, respectively, of the microcontroller 205. Although not illustrated, the Rx+ and Rx− inputs of each secondary device 215a-c can also be electrically coupled with the transmission lines coupled with the Rx+ and Rx− inputs, respectively, to the primary device 205. In this manner, each secondary device 215a-c has the option of communicating a signal directly to (or from) each other secondary device 215a-c independently of the primary device 205 (that is to say, without relying on the primary device 205 to receive the signal, process it and transmit a corresponding signal to another secondary device 215a-c).

Although FIG. 2 shows three secondary devices 215a-c coupled with the transmission lines of the logic bus 210, the arrows to the right of FIG. 2 indicate that the transmission lines can be longer than depicted in FIG. 2, and thus can support additional drop connections to additional secondary devices. For example, the transmission lines can be selectively extended (as will be described more fully below) or they can have a fixed length longer than shown in FIG. 2. Moreover, fewer or more secondary devices than the illustrated secondary devices 215a-c can be coupled with the transmission lines of the logic bus 210 in a manner similar to that shown in FIG. 2 and/or described above.

Figure 3:
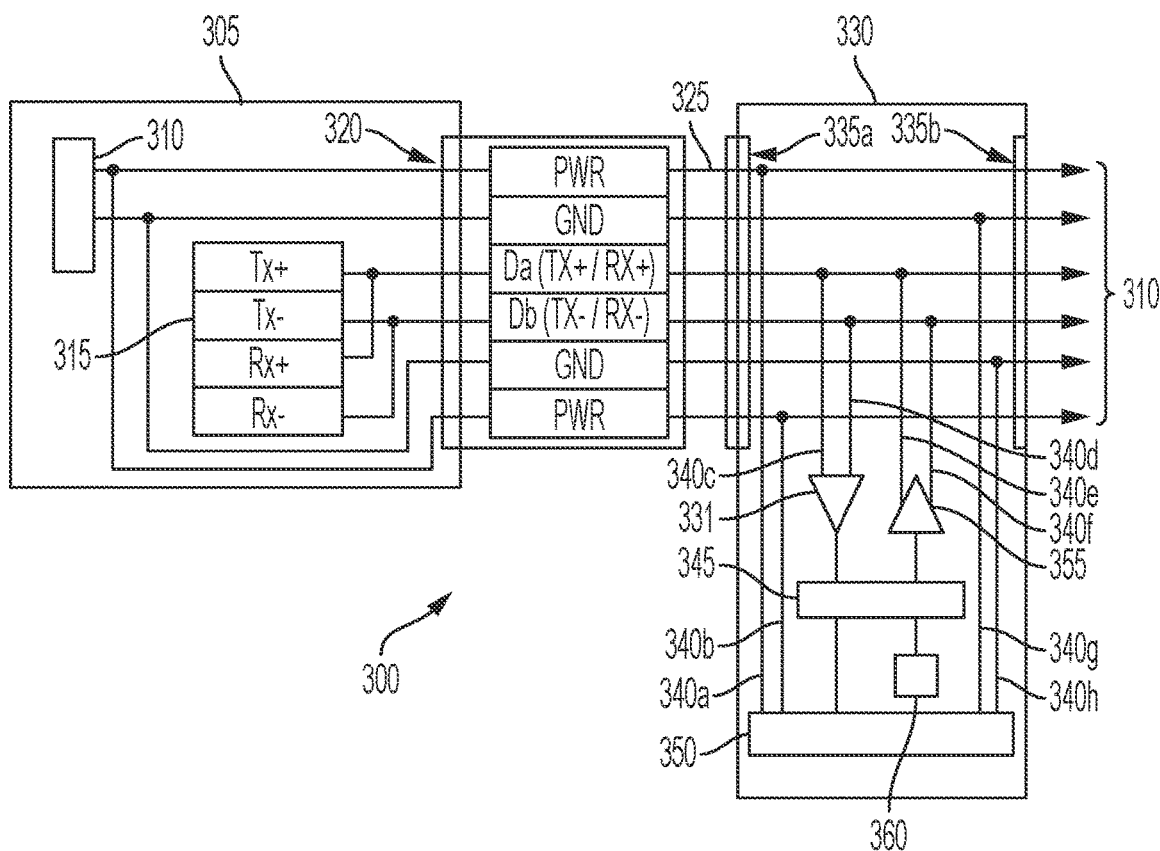
FIG. 3 schematically illustrates aspects of a multi-point, differential logic bus suitable for half-duplex communication between and amount a plurality of nodes.

Referring now to FIG. 3, a half-duplex communication protocol allows data to be communicated in two directions over a single pair of transmission lines, albeit during different timeframes. In other words, one node can be in a transmission mode to transmit data during one timeframe and then can shift to a reception mode to receive data during another time frame. Half-duplex communication still allows nodes to transmit and to receive data to any other node(s) on a multi-point bus 310. However, with half-duplex communication, each node 330 transmits data during one timeframe and receives data during another timeframe (e.g., not concurrently as is possible with a full-duplex communication bus and protocol described above). An example of a multi-point, differential bus capable of half-duplex communication is shown by way of example in FIG. 3.

In FIG. 3, the accessory network 300 includes a primary device 305 (e.g. a microcontroller) with a power supply 307 that provides a power connection and a ground connection capable of supplying a selected output current (e.g., about 10 A, such as, for example, between about 3 A and about 25 A, with between about 8 A and about 15 A being but one exemplary range) at a selected output voltage (e.g., 12 V, such as, for example, between about 11 V and about 14.5 V, with between about 11.5 V and about 13 V being but one exemplary range). As well, the microcontroller 305 has transceiver circuitry 315 configured to output differential signals (e.g., indicated by the blocks Tx+ and Tx−) over the logic bus 310. The transceiver circuitry 315 also is configured to receive differential signal inputs (e.g., indicated by the blocks Rx+ and Rx−) over the logic bus 310. The microcontroller 305 also includes a suitable electrical connector 320 for coupling the power, ground and signaling connections of the microcontroller's transceiver circuitry 315 with one or more secondary or accessory devices or nodes 330.

In FIG. 3, an electrical cable 325 is schematically illustrated coupling the microcontroller 305 with one accessory node 330. That accessory node 330 is also shown having a first connector 335a for connecting with the electrical cable 325 (or another electrical connector) and a second connector 335b for connecting with a further accessory node (not shown) in a "daisy chained" arrangement. As used herein, the term "daisy chained" refers physically serial couplings between or among physical components, e.g., that tend to lengthen a logic bus, notwithstanding that the physical components may include logic nodes (or devices) that have parallel electrically connections to a logic bus.

For example, FIG. 3 schematically illustrates an exemplary accessory node 330, which can be a smart fan or other accessory, that physically extends the transmission lines of the logic bus 310 from the first connector 335a to the second connector 335b. The accessory node 330 also includes drop connections (e.g., parallel electrical connections 340a-h) to the power lines (PWR), ground lines (GND), and the data lines (labeled as Da (Tx+/Rx+) and db (Tx−/Rx−), respectively). As the logic bus 310 shown in FIG. 3 has but two signal lines, the microcontroller 305 and the accessory node 330 synchronize their timeframes for receiving and transmitting in a half-duplex fashion (e.g. by a processing unit 345 of the accessory node 330 synchronizing with microcontroller 305), as described above.

For example, when the microcontroller 305 is in a data-transmit mode, the accessory node 330 is in a data-receive mode. In this mode, the receiver 331 of accessory node 330 listens for a signal containing its unique address and communicates signals with its address to the processing unit 345 of accessory node 330. The processing unit 345 processes the received signal and can output a signal to a transducer 350. As used herein, the term "transducer" is a device that manifests a physical output responsive to an input signal, or that transforms a physical input to an electrical output signal. In the case of a smart fan of the type shown in FIG. 1, the transducer 350 can be a brushless DC motor used to urge a rotor having a plurality of airfoils in rotation. In the case of a lighting accessory, the transducer 350 can be one or more LED elements that illuminate. In some embodiments, the LED elements illuminate at a selected intensity or color according to the incoming signal (e.g., from the primary device 305 or from the processing unit 345). For example, the signal received from the primary device 305 can be a digital signal and the processing unit 345 of the accessory node 330 can output a pulse-width-modulated (PWM) signal for controlling a speed of a fan motor.

When the primary device 305 is in a data-receive mode, the processing unit 345 of the accessory node 330 can be in a data-transmit mode. In this mode, the transmitter 355 of the accessory node 330 can emit a signal. The emitted signal can contain the accessory node's 330 unique address so the primary device 305 can identify the source of the incoming information. In an embodiment as depicted in FIG. 3, a sensor transducer 360 can observe its environment and communicate a signal to the processing unit 345 of the accessory node 330.

For example, the sensor transducer 360 can be a Hall-effect sensor configured to observe a rotational speed of an electric motor. In other embodiments, the sensor transducer 360 can observe an environmental temperature or a barometric pressure. In still other embodiments, the sensor transducer 360 can be light sensitive, e.g., to observe an ambient brightness, or can be a microphone or other sensor configured to observe ambient sound or other environmental pressure phenomena. And, although a single sensor transducer 360 is shown, an accessory node 330 can incorporate any selected number of sensor transducers, each of which can output a signal to the processing unit 345, which in turn can digitize the signal and communicate the digitized form of the transducer signal over the logic bus 310. For example, the processing unit 345 can encode data it receives from each sensor transducer 360 and can transmit a differential signal onto the logic bus 310. Provided that the communication protocol used over the logic bus 310 provides a long-enough word (e.g., enough bandwidth) to permit a suitable data encoding of the output from each transducer, an accessory node 330 can incorporate any selected number of sensor transducers 360.

Each node (including the primary device 305) that is in a data-receive mode can receive the data transmitted by the accessory node 330. To facilitate communication among accessory nodes 330 as well as with the primary device 305, e.g., rather than merely between the primary device 305 and each accessory node 330, the accessory nodes 330 and the primary device 305 can switch between a data-receive mode and a data-transmit mode in a round-robin format. For example, a half-duplex bus as in FIG. 3 having a primary device 305 and a drop connection to three accessory nodes 330a-c (additional accessory nodes not illustrated) as in FIG. 3 can implement a round-robin approach. In this approach, the primary device 305 can be in a data-transmit mode and the three accessory nodes 330a-c can be in a data-receive mode during a first timeframe. During a second timeframe (e.g., following the first timeframe), the first accessory node or device 330a can switch to a data-transmit mode and the primary device 305 can switch to a data-receive mode, which the other two accessory devices 330b-c remain in a data-receive mode. During the second timeframe, each device connected to the logic bus 310 can receive the output transmitted by the first accessory device 330a. During a third timeframe following the second timeframe, the first accessory device 330a can return to the data-receive mode and the second accessory device 330b can switch to a data-transmit mode. During the third timeframe, each device connected to the logic bus 310 can receive the output transmitted by the second accessory device 330b. During a fourth timeframe following the third timeframe, the second accessory 330b device can return to the data-receive mode and the third accessory device 330c can switch to a data-transmit mode. During the fourth timeframe, each device connected to the logic bus 310 can receive the output transmitted by the third accessory device 330c.

Other switching protocols can be similarly implemented. For example, every other or every third timeframe can see all accessory devices 330 switched to the data-receive mode and the primary device 305 can switch to the data-transmit mode. Further, the round-robin (or other switching protocol) employed by a particular network embodiment can be selected in real-time by the primary device 305 according to, for example, a number of accessory devices 330 connected to a given logic bus 310 or according to an observed environmental condition.

Regardless of whether communication occurs using a full-duplex or a half-duplex protocol, each message transmitted by a device can include one or more identifier-bytes (e.g., address-bytes) for identifying the node to which the message is intended. Thus, while all devices on the multipoint bus (e.g., 210, 310) can receive the message, each device can be programmed to respond only when the received message is addressed to it.

A logic bus as described allows a primary device or microcontroller to control operation of each accessory node independently of the others, as well as to receive and interpret data from each accessory node independently of the others. It also allows each accessory node to respond to a condition observed by one or more other accessory nodes. For example, each device electrically coupled with a given bus can communicate with each accessory node independently of the other devices connected to the bus, e.g., by transmitting a word (or other digitized signal) that includes a unique address of the targeted accessory node. Similarly, each accessory node can communicate with each of the other accessory nodes and the primary device or microcontroller independently of each other, as by transmitting a word (or other digitized signal) that includes a unique address of the targeted accessory node (as well as, in some embodiments, the address of the transmitting accessory node).

Moreover, a logic bus 310 as depicted in FIG. 3 can also deliver power to each accessory node 330. For example, the logic bus 310 provides two power lines (PWR) and two ground lines (GND). Moreover, the drop connections 340a, 340b, 340g, 340h to the transducer 350 in FIG. 3 shows that the transducer (e.g., a fan motor) can electrically couple with one or both power lines (PWR) and one or both ground lines (GND). For instance, a transducer 350 that is expected to draw only a low current could be electrically coupled with just one of the power lines (PWR) and one of the ground lines (GND), whereas a transducer 350 expected to draw higher current can couple to both power lines and both ground lines. Still further, although not shown in FIG. 3, the transducer 350 can incorporate additional power-electronics, e.g., to step down the voltage, e.g., from 12 V, to a lower voltage, e.g., 5 V, suitable for the particular transducer. For instance, some LEDs operate at 5V. Conditioning the supplied power on each accessory node (rather than centrally) can allow the logic bus 310 depicted in FIG. 3 to service a larger variety of accessory nodes and efficiently deliver power to them (e.g., using lower current), e.g., from the power supply 307.

Figure 4:
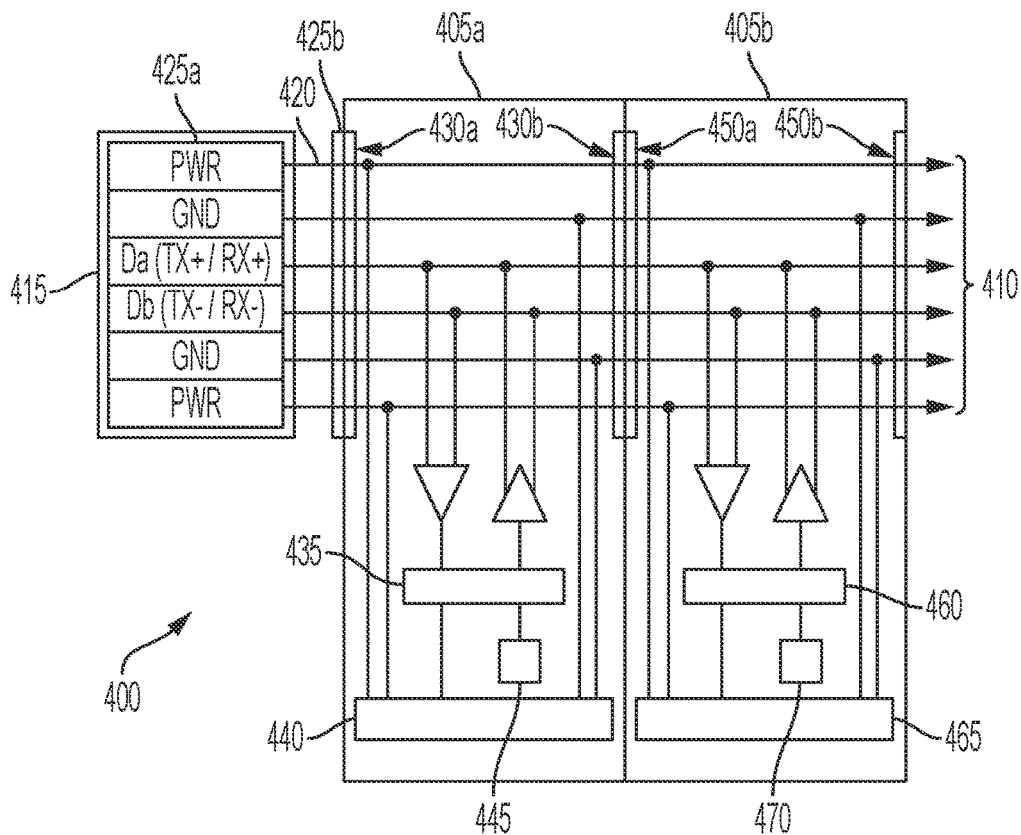
FIG. 4 schematically illustrates aspects of a logic bus similar to the logic bus shown in FIG. 3.
Figure 5:
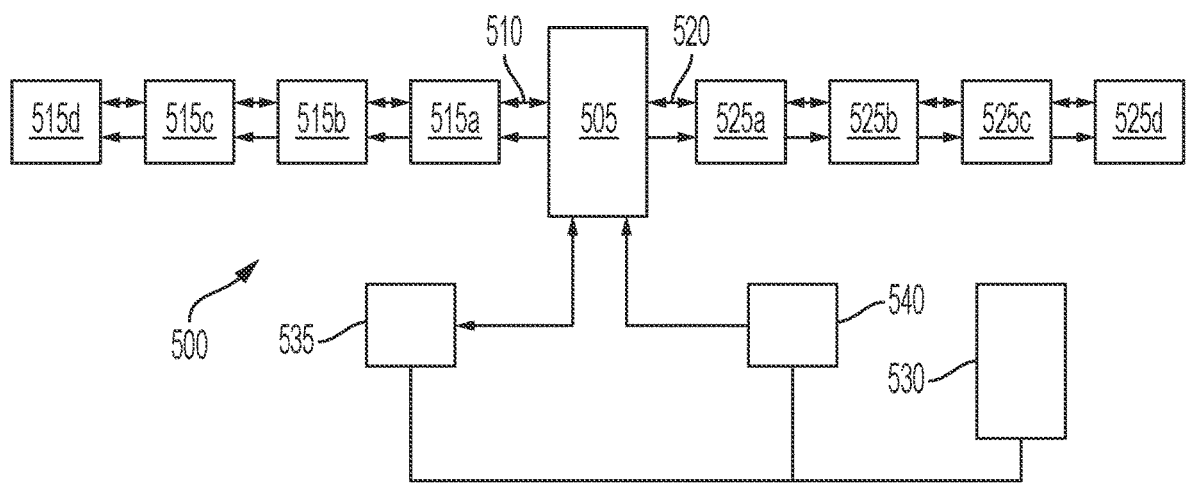
FIG. 5 schematically illustrates a network of devices logically interconnected with a bus similar to that shown in FIGS. 2, 3 and 4.

FIG. 4 shows an exemplary accessory network 400 having a logic bus 410 as in FIG. 3 expanded to incorporate a plurality of accessory nodes 405a, 405b. For example, referring again to FIG. 1, each fan in the bank of fans 100 can be an accessory node 330 as depicted in FIG. 3, ganged together with one or more other accessory devices, as depicted in FIG. 4. FIG. 1 shows an example of gangedtogether fans and FIG. 4 schematically shows two accessory nodes 405a, 405b ganged together, with the option to add additional devices. FIG. 5 shows a further schematic illustration of several network-controllable accessories ganged together.

As shown in FIG. 4, a primary device or microcontroller 415 (such as, for example, primary device 305 in FIG. 3 or logic hub 505 in FIG. 5) can be coupled with an expandable logic bus 410. For example, FIG. 4 schematically shows a cable 420 spanning from a first connector 425a to a second connector 425b. From top to bottom, the pinout of the first connector 425a is as follows: Pin 1—Power (+12 V); Pin 2—Ground; Pin 3—Da; Pin 4—db; Pin 5—Ground; Pin 6—Power. The cable 420 provides one or more electrical conductors corresponding to each of Pins 1 through 6, and each conductor corresponding to a given Pin electrically couples with that pin in the first connector 425a. At an opposite end of the cable 420, each conductor electrically couples with a corresponding Pin of the second connector 425b.

In FIG. 4, the second connector 425b matingly engages with a correspondingly configured first connector 430a of the first accessory node 405a. The first accessory node 405a includes an electrical interconnect segment that spans from each pin in the first connector 430a to a corresponding pin in the second connector 430b. The electrical interconnect segment can be a wire harness having a plurality of electrically isolated conductors, an interconnect substrate having a plurality of electrical tracks, or a combination of wire harness and interconnect substrate. In any event, the electrical interconnect provides one or more electrically isolated conductors, each of which spans from a given contact of the first connector 430a to a corresponding contact of the second connector 430b. Further, a logic component 435 (such as a processing unit) and transducer components 440, 445 of the first accessory node 405a can electrically couple with one or more of the conductors of the interconnect to achieve drop connections as described above, e.g., with respect to FIG. 3.

By way of further reference to FIG. 4, a second accessory node 405b can be ganged together (or daisy-chained) with the first accessory node 405a. For instance, an electrical biscuit-connector (FIG. 8) can matingly engage with the second connector 430b of the first accessory node 405a and the first connector 450a of the second accessory node 405b, extending the logic bus 410 to include the electrical interconnect of the second accessory node 405b. Like with the first accessory node 405a, the electrical interconnect of the second accessory node 405b spans from one pin of the first connector 450a to a corresponding pin of the second connector 450b. The electrical interconnect can be a wire harness having a plurality of electrically isolated conductors, an interconnect substrate having a plurality of electrical tracks, or a combination of wire harness and interconnect substrate. In any event, the electrical interconnect provides one or more electrically isolated conductors, each of which spans from a given contact of the first connector 450a to a corresponding contact of the second connector 450b. As with the first accessory node 405a, a logic component 460 (such as a processing unit) and transducer components 465, 470 of the second accessory node 405b can electrically couple with one or more of the conductors of the interconnect 410 to achieve drop connections as described above. And, as with the first accessory node 405a, the second accessory node 405b can have a second connector 450b. The second connector 450b can be configured to receive, e.g., an electrical biscuit-connector (or other connector) to further extend the logic bus 410 to another accessory device (not shown in FIG. 4).

FIG. 5 schematically illustrates a network 500 of several accessories interconnected with each other over a logic bus as described above with reference to FIGS. 1 through 4. In FIG. 5, a logic hub 505 (e.g., a primary device or microcontroller) has a first connection 510 to a first accessory node 515a and a second connection 520 to a second accessory node 525a, forming two branches of accessory nodes (e.g., the first branch includes nodes 515a-d and the second branch includes nodes 525a-d). With a logic bus and communication protocol (whether full-duplex or half-duplex) as described above, each branch 515a-d, 525a-d of accessory nodes can incorporate additional accessory nodes. As shown in FIG. 5, each branch 515a-d, 525a-d of accessory nodes can include three or more accessory devices, each having an on-board processing unit as described in relation to FIGS. 3 and 4. Of course other embodiments are possible, e.g., where a given branch of accessory nodes includes more than four accessory nodes, such as, for example, between 5 accessory nodes and 15 accessory nodes, with 7 accessory nodes being but one particular example. In an embodiment as shown in FIG. 5, the first branch 515a-d and the second branch 525a-d includes a same number of accessory devices. In other embodiments, the first branch of accessory nodes may have more or fewer accessory devices compared to the second branch. In still other embodiments, a logic hub 505 connects to only one "branch" of accessory nodes, either because the logic hub provides just one physical connector for daisy-chaining accessory nodes (as in FIGS. 3 and 4) or because a given system embodiment does not benefit from more than one "branch" of accessory devices. As FIG. 5 shows, a general-purpose computing environment 530 can provide a communication connection 535 with the logic hub 505, e.g., via a USB connection. Similarly, a power supply output 540 from the general purpose computing environment 530 (e.g., a PCIe connection) can supply power to the logic hub 505.

III. Electrical Connectors

Figure 6:
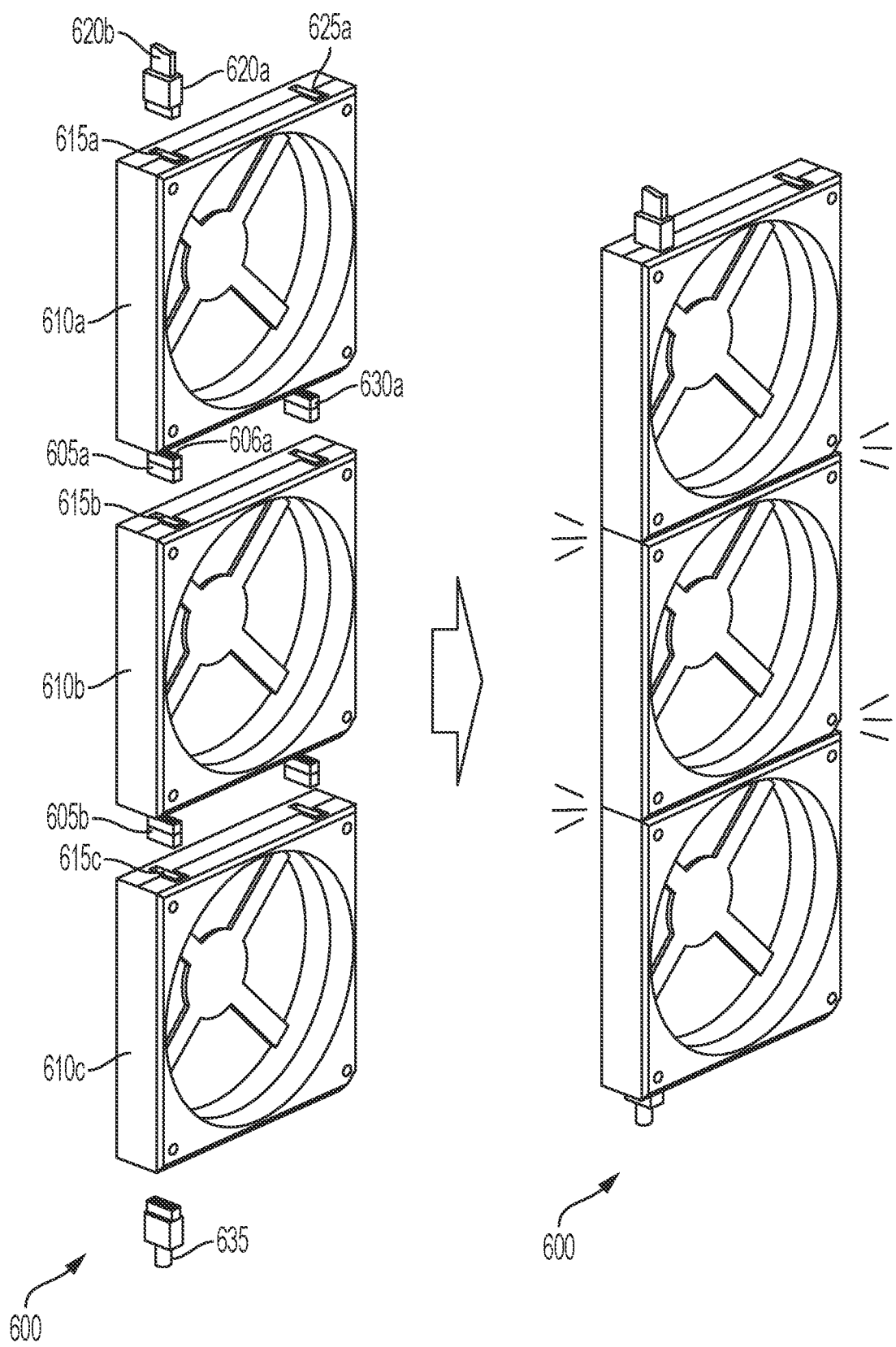
FIG. 6 illustrates an exploded view of a bank of fans as in FIG. 1, as well as the assembled bank of fans.

As shown by way of example in FIG. 6, an electrical biscuit-connector 605a, 605b can allow individual fans 610a-c (or other accessory nodes) to be daisy-chained together, as described above, while obscuring the physical interconnection from sight. Further, a physical connection between accessory nodes 610a-c provided by an electrical biscuit-connector 605a, 605b can simplify overall system wire management by eliminating conventional cables from the installation. In FIG. 6, the first fan 610a has a first connector 615a, with electrical connections, that matingly receives a complementarily configured connector 620a at a terminal end of a cable 620b. Although not illustrated, the cable 620b extends to a primary device or microcontroller and thus is analogous to the cable 420 shown in FIG. 4. As with the first accessory node 405a in FIG. 4, the first fan 610a in FIG. 6 has an electrical interconnect that extends the bus from the first connector 615a to a second connector (not visible in FIG. 6). The first fan 610a also has a first microcontroller (not shown) with a drop connection from the electrical interconnect, as described above. Further, like the first accessory node 425a in FIG. 4, the first fan 610a of FIG. 6 includes a motor that receives power and ground connections from power and ground conductors of the interconnect. First fan 610a also includes a first socket 625a defined by the housing of first fan 61a, which in the illustrated embodiment is intended to accommodate physical attachment and includes no electrical connections. In other embodiments first socket 625a may include electrical connections.

A second electrical connector of first fan 610a (not shown, but similar to the first electrical connector 615a and analogous to the second electrical connector 430b shown in FIG. 4) matingly receives a first end 606a of an electrical biscuit-connector 605a. Additionally, a second socket of first fan 610a (not visible, but analogous to the first socket 625a on the first fan 610a) defined by the housing of the first fan 610a matingly receives a physical biscuit-connector 630a (or an electrical biscuit-connector, though the second socket includes no electrical connections). The physical coupling between the first fan 610a and the second fan 610b provided by the electrical biscuit connector 605a and the physical biscuit-connector 630a secures the fans 610a-b together. And, the electrical biscuit-connector 605a provides electrical connections from conductors of the interconnect of first fan 610a to corresponding conductors of the interconnect of second fan 610b, extending the bus across the second fan 610b in a manner analogous to the bus extension provided across the second accessory device 405b in FIG. 4.

Similar connections are provided between the second fan 610b and the third fan 610c, as shown in FIG. 6. Further, the electrical bus (e.g., power, ground and signal) through the bank of fans 600 shown in FIG. 6 can extend to one or more additional devices, as described above in connection with FIG. 5. The cable 635 shown in FIG. 6 indicates further daisy-chained accessory nodes can be included with the bank of fans 600.

Details of an electrical biscuit-connector are described by way of reference to FIGS. 7 through 10. Although various bus configurations are contemplated under this disclosure, the busses shown in FIGS. 3 and 4 have the six conductors indicated in FIG. 7. As noted above, from top to bottom, the conductors are as follows: Conductor 1—Power (+12 V) (PWR); Conductor 2—Ground (GND); Conductor 3—Da; Conductor 4—db; Conductor 5—Ground (GND); and Conductor 6—Power (+12 V) (PWR). FIGS. 8, 9 and 10 depict an electrical biscuit-connector 800 that can engage with an edge connector having a pinout corresponding to the conductors shown in FIG. 7.

Figure 13:
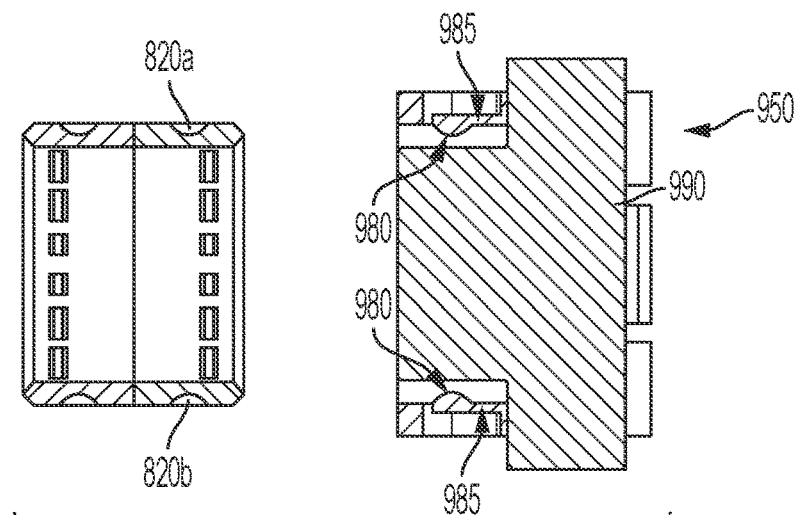
FIG. 13 shows a cross-sectional plan view of the electrical biscuit-connector shown in FIG. 8 and the connector socket and edge connector shown in FIGS. 11 and 12.

Referring now to FIGS. 8, 9 and 10, an exemplary electrical biscuit-connector 800 is described. The electrical biscuit-connector 800 has a housing enclosure 805 (illustrated as housing portions 805a and 805b in the exploded view of FIG. 8) extending from a first end 810 to a second end 815. The first end 810 of the housing enclosure 805 defines a first recessed opening 811, and the second end 815 of the housing enclosure defines a second recessed opening (not shown). The housing enclosure 805 also defines an external surface having a first detent region 820a positioned proximate the first end 810 and a second detent region 820b positioned proximate the second end 815. Each of the first detent region 820a and the second detent region 820b is configured to mechanically catch a corresponding detent region of another device (e.g., a cantilevered boss 980 on a spring-arm 985, as in FIG. 13). In general, a detent device has a recessed region defined by a first component and a ball, boss or other resiliently movable protrusion defined by another component. The ball, boss or other resiliently movable protrusion mates with (e.g., seats in) the recessed region of the first component, thereby retaining the first component with the second component against a threshold separation force. For instance, in FIG. 8, the housing enclosure 805 is shown defining a first recess 820a and a second recess 820b. FIG. 13 (which, as explained more fully below, shows a cross-sectional view of a socket configured to receive the electrical biscuit-connector) has a resiliently movable, cantilevered boss or other protrusion 980. When the housing enclosure 805 is inserted into the socket shown in FIG. 13, each boss 980 urges laterally outward of the housing enclosure 805 until the respective boss seats in the recess 820a, 820b. Once seated in the recess, the boss "catches" or retains the housing enclosure 805 within the socket until a withdrawal force applied to the housing enclosure overcomes the inward spring force applied to the boss 980 by the spring-arm 985. In another embodiment, a set screw can provide the mechanical catch that engages with one or more of the recesses defined by the enclosure housing. For example, once a bank of fans 600 is daisy-chained together as in FIG. 6, a set screw can be threaded into an opening aligned with the recess 820a, 820b defined by the biscuit-connector. A distal end of the set screw (not shown) can seat against the housing enclosure in the recess 820a, 820b similarly to the boss 980, inhibiting or preventing disengagement of the biscuit-connector from the fan (until the set screw is removed).

Referring again to FIG. 8 for ease of illustration, the electrical biscuit-connector has a first plurality 825a of cantilevered arms (e.g., an upper-row of pins, or electrical contacts) arranged opposite a corresponding second plurality of cantilevered arms 825b (e.g., a lower-row of pins, or electrical contacts). The first and second pluralities of cantilevered arms are positioned within the first recessed opening 811 of the housing enclosure 805 (e.g., the first housing portion 805a). Further, each of the cantilevered arms in the first plurality of cantilevered arms 825a and the second plurality of cantilevered arms 825b defines an electrical-contact region 830 (e.g., shown in FIGS. 9 and 10).

The electrical biscuit-connector 800 also has a third plurality of cantilevered arms 825c (e.g., an upper-row of pins, or electrical contacts) arranged opposite a corresponding fourth plurality of cantilevered arms 825d (e.g., a lower-row of pins, or electrical contacts). The third and fourth pluralities of cantilevered arms 825c,825d are positioned within the second recessed opening (not shown) of the housing enclosure 805 (e.g., the second housing portion 805b). Further, each of the cantilevered arms in the third plurality of cantilevered arms 825c and the fourth plurality of cantilevered arms 825d defines an electrical-contact region similar to the contact region 830 (e.g., FIG. 10). To facilitate extending an electrical bus from one accessory node to another, each of the cantilevered arms in the first plurality of cantilevered arms 825a is electrically coupled with a corresponding one of the cantilevered arms in the third plurality of cantilevered arms 825c, and each of the cantilevered arms in the second plurality of cantilevered arms 825b is electrically coupled with a corresponding one of the cantilevered arms in the fourth plurality of cantilevered arms 825d.

For instance, as shown in the side-elevation, cross-sectional view in FIG. 10, each pin or arm in the first plurality of cantilevered arms 825a may be continuous and monolithic with a corresponding one of the pins or arms in the third plurality of cantilevered arms 825c. Similarly, each pin or arm in the second plurality of cantilevered arms 825b may be continuous and monolithic with a corresponding one of the pins or arms in the fourth plurality of cantilevered arms 825d.

In FIG. 8, a first retainer 835a retains the top row of pins 825a, 825c in a fixed position and a second retainer 835b retains the bottom row of pins 825b, 825d in a fixed position. In some embodiments (e.g., where one or more of the pins or arms in the first plurality of cantilevered arms 825a is distinct from the corresponding pin or arm in the third plurality of cantilevered arms 825c), the first retainer 835a is configured to retain the first plurality of cantilevered arms 825a in a fixed position relative to the third plurality of cantilevered arms 825c. Similarly, the second retainer 835b can be configured to retain the second plurality of cantilevered arms 825b in a fixed position relative to the fourth plurality of cantilevered arms 825d.

In FIG. 8, the housing enclosure 805 has a first portion 805a and a second portion 805b. The first portion 805a defines the first end 810 of the housing enclosure 805, the first recessed opening 811 of the housing enclosure 805, and the first detent region (e.g., the recess 820a) of the housing enclosure 805. Similarly, the second portion 805b defines the second end 815 of the housing enclosure 805, the second recessed opening of the housing enclosure 805, and the second detent region (e.g., the recess 820b) of the housing enclosure 805.

As the exploded view shown in FIG. 8 indicates, the first portion 805a extends from the first end 810 of the housing enclosure 805 to a first intermediate end, and the second portion 805b extends from the second end 815 of the housing enclosure 805 to a second intermediate end.

FIG. 10 shows that the first intermediate end and the second intermediate end are positioned adjacent each other, and in some embodiments abut each other, when the electrical biscuit-connector 800 is assembled. For example, the first intermediate end and the second intermediate end can have features that matingly engage with each other or are fused together to form housing enclosure 805.

Referring again to FIG. 8 and FIG. 10, the first recessed opening 811 defines a first interior wall (e.g., a lower wall) and a second interior wall (e.g., an opposed upper wall). Moreover, the first recessed opening 811 is so sized relative to the first plurality of cantilevered arms 825a and the second plurality of cantilevered arms 825b as to define a first gap between each of the first plurality of cantilevered arms 825a and the first interior wall and a second gap between each of the second plurality of cantilevered arms 825b and the second interior wall when the biscuit-connector is disengaged from an edge connector of an interconnect substrate (e.g., as in FIG. 11). However, when the biscuit-connector 800 engages with an edge connector of an interconnect substrate, the substrate urges the first plurality of cantilevered arms 825a outwardly toward the first interior wall and urges the second plurality of cantilevered arms 825b outwardly toward the second interior wall. In some embodiments, the plurality of cantilevered arms 825a, 825b urge against the first and second interior walls, respectively, enhancing physical and thus electrical contact between the electrical contact region 830 of each pin of the electrical biscuit-connector 800 and a corresponding pad of the edge connector 905.

Referring still to FIG. 8, the first retainer 835a and the second retainer 835b can be positioned opposite each other, positioning the first plurality of cantilevered arms 825a opposite the second plurality of cantilevered arms 825b. In such an embodiment, the first portion 805a of housing enclosure 805 can extend around a first portion of the first retainer 835a and a corresponding first portion of the second retainer 835b, thus urging the first retainer 835a and the second retainer 835b together. Similarly, the second portion 805b of housing enclosure 805 can extend around a second portion of the first retainer 835a and a corresponding second portion of the second retainer 835b, further urging the first retainer 835a and the second retainer 835b together.

Once assembled as in FIGS. 9 and 10, the electrical biscuit-connector 800 has two planes-of-symmetry. For instance, as FIG. 9 shows, the electrical biscuit-connector 800 is rotationally symmetric about a central longitudinal axis 840 (FIG. 10; "X" in FIG. 9) of the electrical biscuit-connector 800. This symmetry, and the passive nature of the electrical connections provided by the pins, allows the electrical biscuit-connector 800 to be oriented as in FIG. 9 or rotated 180-degrees about the axis X shown in FIG. 9 while providing the same electrical connectivity regardless of its orientation. Similarly, the electrical biscuit-connector 800 is symmetric about a vertical mid-plane 845. This symmetry, and the passive nature of the electrical connections provided by the pins, allows the electrical biscuit-connector 800 to be oriented as in FIG. 10, rotated 180-degrees about a central axis extending orthogonally to the plane shown in FIG. 10 (i.e., at the intersection of the axis 840 and plane 845), or rotated 180-degrees about a central axis oriented vertically within the mid-plane 845 (as shown in FIG. 10) while providing the same electrical connectivity.

Although the electrical biscuit-connector shown in FIGS. 8, 9 and 10 has two rows of pins, each with six pins, other embodiments of the biscuit-connector have more or fewer pins in each row. Further, each row may have the same number of pins and thus enjoy advantages of symmetry as discussed above. Alternatively, one row of pins may have more or fewer pins than the other row. In these alternative embodiments, symmetry about one or more of the axes identified above in connection with FIG. 10 will be lacking. Accordingly, to ensure proper alignment of these alternative electrical biscuit-connectors 800 when mating or being mated with a corresponding socket (such as, for example, electrical connector 615b of second fan 610b of FIG. 6), an asymmetric keying feature can be added to an internal or an external surface of the housing enclosure 805. For example, a keying feature of the electrical biscuit-connector 800 can be a complementarily contoured surface (internal or external) of the housing enclosure 805 that mates with a correspondingly contoured surface of a socket connector 950 (see FIG. 12). In some embodiments, the keying feature is a recess or a protrusion defined by a surface of the housing enclosure 805 that mates with a corresponding protrusion or recess, respectively, defined by the socket 950.

Referring now to FIGS. 11A through 13, a socket connector having a configuration that is complementary to the configuration of the electrical biscuit-connector 800 is described. As shown in FIG. 6, a smart-fan as described herein can incorporate such a socket connector (e.g., connectors 615a-c can embody a socket connector described in relation to FIGS. 11 through 13).

FIG. 11A shows a substrate 900 (e.g., an interconnect substrate) having an edge connector 905 that has a complementary configuration to the electrical biscuit-connector 800 described above and shown in FIGS. 8, 9 and 10. The substrate 900 defines a major region 910, a tongue 915, and a peripheral edge extending around the substrate 900. The tongue 915 extends outward of the major region 910 and defines a first major surface 920 and a second major surface 925 oriented opposite the first major surface 920. However, like the electrical biscuit-connector 800, the edge connector 905 can be 180-degrees symmetric about the axis 930, which provides the second major surface 925 with the same pinout arrangement 935b in FIG. 11B as that shown on the first major surface 920 shown in FIG. 11A. For instance, from left to right in FIG. 11A, the pinout 935a on the first major surface 920 is PWR, GND, Da, db, GND, PWR. Identically, the pinout 935b on the second major surface 925, from left to right in FIG. 11B, is PWR, GND, Da, db, GND, PWR. This symmetry of the edge connector 905 and the electrical biscuit-connector 800 permits the electrical biscuit-connector 800 and the edge connector 905 to mate together properly without regard to whether the electrical biscuit-connector 800 might be "right-side up" or "upside down." Similarly, the edge connector 905 can be rotated about a longitudinal axis 930 and the top-pinout (e.g., 935a in one orientation and 935b in another orientation) and the bottom-pinout (e.g., 935b in one orientation and 935a in another orientation) of the edge connector 905 will remain the same.

The peripheral edge of the substrate 900 has a segment extending around the tongue 915 and from the first major surface 920 to the second major surface 925. In some embodiments, the peripheral edge of the tongue 915 defines one or more recessed regions (not shown) that form a detent region for mating with a corresponding resiliently movable protrusion within an end recess 811 of the electrical biscuit-connector 800.

As noted above, the tongue 915 defines an edge connector 905 having a first plurality of pinouts/electrical contacts 935a exposed to the first major surface 920 and a second plurality of pinouts/electrical contacts 935b exposed to the second major surface 925. The substrate 900 further includes a plurality of electrically conductive tracks (not shown) electrically coupling each of the electrical contacts 935a exposed to the first major surface 920 with a corresponding one of the electrical contacts 935b exposed to the second major surface 925. Further, each electrical track electrically couples one of the exposed plurality of electrical contacts 935a exposed to the first major surface 920, the corresponding electrical contact 935b exposed to the second major surface 925, and a corresponding one or more contacts 940 (e.g., solder pads, through-hole via, or other form of electrical contact) that in turn electrically couples with either a segment of an electrical cable or a logic board (or both). For example, in one embodiment based on the physical connector shown in FIGS. 11A and 11B, the contacts 940 are shown in two rows below the electrical contacts 935a. The pinout of the first row of four contacts 940, in one embodiment, from left-to-right, is Da, Da, db, db. The pinout of the second row of 8 contacts 940, in one embodiment, from left-to-right in FIG. 11A is PWR (+12V), PWR (+12V), GND, GND, GND, GND, PWR (+12V), PWR (+12V). Stated differently, a row of contacts 940 for data lines is exposed to the first major surface 920 at a position between the electrical contacts 935a and the second row of contacts 940 (e.g., eight contacts) defining power and ground connections. The exposed two rows of contacts 940, e.g., solder pads, in turn, correspond to the electrical contacts 935a, 935b and are electrically coupled therewith via tracks defined by the interconnect substrate 900. The signal pad contacts 940 in the first row can electrically couple with corresponding signal connections of a logic component (e.g., a microcontroller) using conductors (e.g., cables, printed-circuit boards, etc.), thereby electrically coupling each respective one of the first-row of contacts 940 with corresponding signal connections of the logic component.

FIG. 12 shows a socket 950 that extends around the tongue 915 as to be configured to matingly receive one end of the electrical biscuit-connector 800 shown in FIGS. 8 through 10. For instance, the connector housing 955 defines a wall 960 recessed from an outer surface 970 and extending around a portion of the tongue 915 to define a gap 975 around the tongue 915 between the recessed wall 960 and the tongue 915. The electrical biscuit-connector's 800 housing enclosure 805 can slide into the gap 975 with its outer surface in sliding contact with and facing an internal major surface of the recessed wall 960. Meanwhile, the tongue 915 of the edge connector 905 can slide into the recessed opening 811 defined by the electrical biscuit-connector 800 and between the opposed pins of the first plurality of cantilevered arms 825a and the third plurality of cantilevered arms 825b, causing the arms/pins to deform and urge against the corresponding exposed electrical contacts 935a, 935b, respectively, of the edge connector 905.

Although visible in FIG. 12, the detent region of the socket 950 is better shown in FIG. 13. As noted above, inwardly facing bosses 980 are positioned on spring arms 985 that cantilever from a main socket body 990. As the electrical biscuit-connector 800 slides into the socket 950, the external surface of the electrical biscuit-connector's 800 housing enclosure 805 urges the bosses 980 (and thus the spring arms 985) laterally outward until the boss 980 is in opposed relation to the recess portions 820a, 820b defined by the housing enclosure 805 (FIG. 8), at which point the boss 980 seats within the one of the recess positions 820a, 820b, releasing a portion of the internal spring force retained by the cantilevered arm 985. the seating of the bosses 980 in the recesses 820a, 820b provides a retaining force that resists removal of the electrical biscuit-connector 800 from the socket 950, as the bosses 980 (and thus the cantilevered spring arms 985) must move laterally outward from the recesses 820a, 820b in order for the electrical biscuit-connector 800 to slide out of the socket 950.

Figure 14:
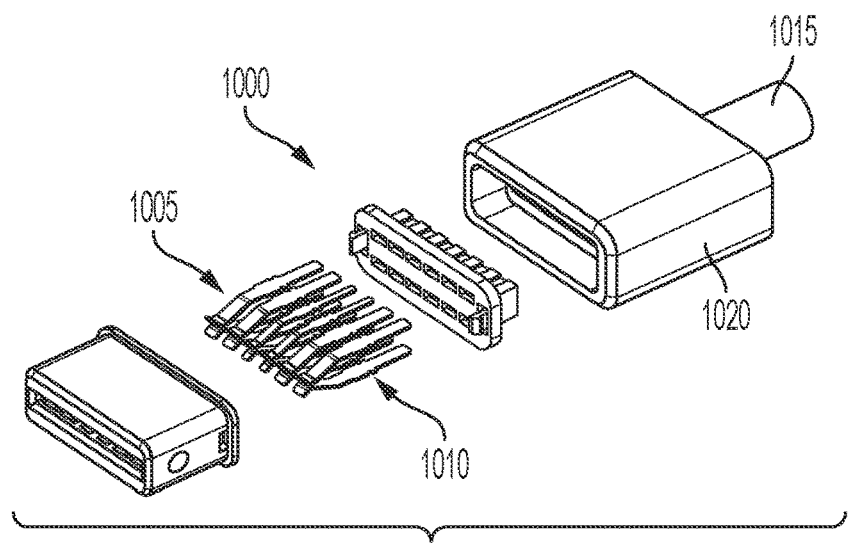
FIG. 14 shows a cable-connector compatible with the connector socket and edge connector shown in FIGS. 11 and 12.
Figure 15:
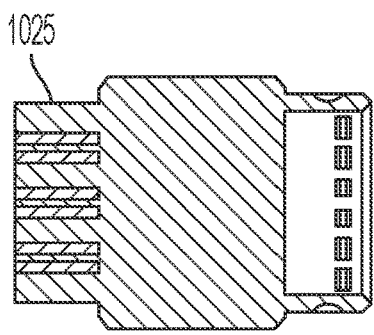
FIG. 15 shows another cable-connector compatible with the connector socket and edge connector shown in FIGS. 11 and 12.
Figure 16:
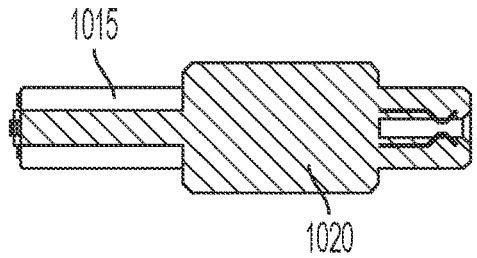
FIG. 16 shows a cross-sectional, side-elevation view of the cable connector shown in FIG. 14.

FIGS. 14, 15 and 16 illustrate aspects of another electrical connector 1000 compatible with the edge connector 905 shown in FIGS. 11, 12 and 13. The connector 1000 shown in FIGS. 14, 15 and 16 shares a electrical contact arrangement/pinout with the electrical biscuit-connector 800, but rather than being symmetrical about a vertical axis as the electrical biscuit-connector 800 is in FIG. 10, the connector 1000 shown in FIG. 14 provides a first (e.g., top) plurality of pins 1005 and a second, opposed (e.g., bottom) plurality of pins 1010. Each pin in the first plurality of pins 1005 corresponds to one pin in the second plurality of pins 1010, defining a plurality of pairs of pins. Each pair of pins, in turn, is electrically coupled with a corresponding one or more electrical conductors in a cable 1015 extending away from the connector body 1020. As shown in FIGS. 14 and 16, the cable can be a circular cable 1015. Or, as shown in FIG. 15, the cable can be a ribbon cable 1025. As with the pin-out of the electrical biscuit-connector 800, the top plurality/row of pins 1005 in the connector 1000 can have a same pinout from left-to-right in FIG. 14 that the bottom plurality/row of pins 1010 has from right-to-left, providing a 180-degree symmetry of the connector 1000, as with the biscuit-connector 800.

FIG. 17 illustrates aspects of a logic hub 1050 analogous to the logic hub 505 shown in FIG. 5. In FIG. 17, the logic hub 1050 has a primary microcontroller and one socket connector 950 as described above in relation to FIGS. 11 through 13, providing a single bus for daisy chaining accessory devices or nodes together. In FIG. 18, an alternative logic hub 1060 is shown in an exploded view. The logic hub 1060 shown in FIG. 18 includes a primary microcontroller and two socket connectors 950 providing two busses for daisy chaining accessory devices or nodes together in a manner similar to that shown in FIG. 5.

In the case of both logic hubs 1050 and 1060, a substrate defines a major region (1065 ro logic hub 1050 and 1070 for logic hub 1060), one or more tongues 915, and a peripheral edge. Each tongue 915 extends outward of the major region 1065, 1070 and defines a first major surface and a second major surface oriented opposite the first major surface (such as major surfaces 920, 925 in FIGS. 11A and 11B). As in FIGS. 11A and 11B, each tongue 915 in FIGS. 17 and 18 defines an edge connector having a first plurality of electrical contacts exposed to the first major surface (see FIG. 11A) and a second plurality of electrical contacts exposed to the second major surface (see FIG. 11B). The substrate 1065, 1070 further includes a plurality of electrically conductive tracks (not shown). Each in the plurality of electrically conductive tracks is electrically coupled with one of the electrical contacts exposed to the first major surface of the edge connector and a corresponding one of the electrical contacts exposed to the second major surface of the edge connector.

Each logic hub 1050, 1060 has a logic component (e.g., a primary microcontroller analogous to the microcontroller of logic hub 505 shown in FIG. 5) mounted to the substrate 1065, 1070 and having a plurality of electrical connections. Each in the plurality of electrical connections of the logic component is electrically coupled with at least one of the plurality of electrically conductive tracks, electrically coupling each of the plurality of electrical connections of the logic component with a corresponding contact of the edge connector.

Each logic hub 1050, 1060 also has a corresponding housing enclosure (1051 for logic hub 1050 and 1061 for logic hub 1060) for the logic board. The housing enclosure 1051, 1061 has a peripheral wall 1052, 1062 positioned outwardly of the peripheral edge of the substrate 1065, 1070 that defines an outer surface. The housing enclosure 1051, 1061 also includes a connector housing 955 defining a wall 960 (FIG. 12) recessed from the outer surface of the peripheral wall 1052, 1062 and extending around a portion of the tongue 915 to define a gap 975 around the tongue between the recessed wall and the tongue. As discussed above, the housing enclosure of the biscuit-connector 800 (FIG. 8) or the cable-connector 1000 (FIG. 14) can slide into the socket 950 defined by the recessed wall to occupy the gap 975 (see FIG. 12) between the tongue 915 and the recessed wall 960, while simultaneously causing the tongue's 915 edge connector to slide between the opposed pins of the electrical biscuit-connector 800 or cable connector 1000, electrically coupling the exposed contacts of the edge connector with the internal pins of the electrical biscuit-connector 800 or cable-connector 1000.

Such a logic hub 1050, 1060 can include a logic component, such as a microprocessor, configured to control each in a plurality of fans and a plurality of accessories. Such accessories can include one or more lighting elements corresponding to the plurality of fans. In an embodiment, the accessories include a lighting element corresponding to each in the plurality of fans. As discussed above, the logic component can control each of the fans independently of each other or in concert with each other. Similarly, the accessories (e.g., the lighting elements) can be controlled independently of each other or in concert with each other. Additionally, the accessories can be controlled independently of each fan (or all of them) or in concert with one of the fans (or all of them).

IV. Smart-Fan Components with Reduced Thickness

Figure 19:
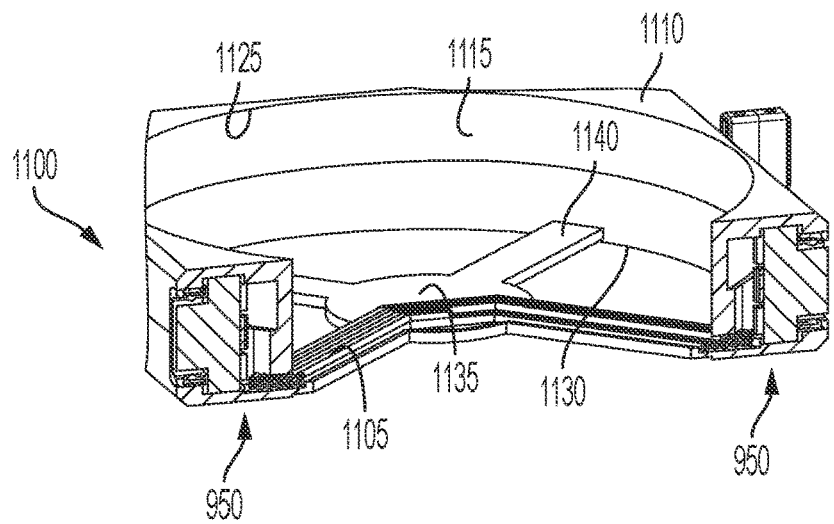
FIG. 19 shows a partial cross-section view of an embodiment of a fan similar to the fans shown in FIGS. 1 and 6.

Smart-fan components and associated improvements are described in relation to FIGS. 19 through 23. The partial cross-sectional view shown in FIG. 19 reveals portions of two electrical sockets 950 of the type described in relation to FIGS. 11 through 13, above, each of which is compatible with an electrical biscuit-connector 800 described herein. FIG. 19 also depicts a segment 1105 of a logic bus that can be daisy chained with another segment of a logic bus to extend the bus, as described above in relation to FIG. 4. Accordingly, the fan 1100 partially illustrated in FIG. 19 is suitable for daisy chaining with other fans to define a bank of fans as in FIGS. 1 and 6.

Several approaches are available to facilitate daisy chaining, such as, for example, with an asymmetric pin-out as illustrated in FIG. 7. For example, the pinout in FIG. 7 provides one Da pad and one db pad, which are not interchangeable with each other. With an edge connector as in FIG. 9, the Da pad and the db pad are on opposite sides of the longitudinal axis 930 from each other. Accordingly, when assembling a bank of fans as in FIG. 6 using embodiments of a fan as in FIG. 19, the Da pad on one of the connectors 950 will be positioned opposite the db pad of an adjacent fan's connector. For example, referring to FIG. 6, the Da pad of the socket 615*b* of the second fan 610*b* will be positioned directly opposite the db pad of the opposed socket (not shown) of the first fan 610*a*. In such an embodiment, the electrical biscuit-connector 605*a*/800 can provide a physical cross-link for the data pins, such that the Da pin of the socket 615*b* electrically couples with the Da pin of the opposed socket, which is not visible in FIG. 6.

Alternatively, the pinout of the edge connector within the socket 615*b* can be reversed from that of the opposed socket. Stated differently, (referring now to FIG. 19), the fan's interconnect 1105 can provide a physical cross-link of the data lines, so that the pinout of the socket 950 on the left of FIG. 19 is opposite that of the socket 950 on the right of FIG. 19. In this alternate embodiment, the biscuit-connector 605/ 800 need not provide a cross-link of the Da and db pins between the opposed first end and second end of the connector.

As yet another alternative, the pinout shown in FIG. 7 can be expanded to 8 electrical connections that provide symmetry relative to the longitudinal axis 930 of the edge connector 905 (FIG. 11A). As one example, such a pinout can be as follows: PWR, GND, Da, db, db, Da, GND, PWR. With this pinout arrangement, no physical cross-link will be needed in either the electrical biscuit-connector 605/800 or on the edge connector 905.

In FIG. 19, a housing 1110 defines a duct region 1115 for receiving a fan rotor 1120 (FIG. 21). The duct region 1115 extends from a first face 1125 to an opposed second face 1130. The housing 1110 also defines a hub region 1135 and a corresponding plurality of struts 1140 extending radially outward of the hub region 1135 and spanning across the second face 1130 of the duct region 1115. Although not shown in FIG. 19, the hub region 1135 of the housing supports an interconnect substrate which in turn supports a logic component and an electric motor that urges a fan rotor (e.g., analogous to the fan rotor 1120 shown in FIG. 21) to rotate. As the fan rotor turns, airfoils defined by the rotor urge air to pass through the duct region. Although the smart fan shown in FIG. 19 includes heretofore unknown improvements, e.g., that permit the fan to be daisy-chained with other fans as in FIG. 6, further improvements are possible.

For instance, referring now to FIGS. 20 and 21, the hub 1135 and struts 1140 defined by the housing 1110 in FIG. 19 can be eliminated and replaced by an innovative interconnect substrate 1155. In an embodiment as in FIGS. 20 and 21, the interconnect substrate 1155 defines a hub 1160 and a plurality of struts 1165 extending outwardly of the hub and spanning across the duct region 1170 of the housing 1175. However, unlike the hub-and-struts in FIG. 19 that are defined by the housing 1110, the interconnect substrate 1155 in FIGS. 20 and 21 defines a plurality of electrical tracks, each of which electrically couples at least one region of the interconnect substrate 1155 with another region of the interconnect substrate 1155.

This arrangement, which eliminates the hub 1135 and struts 1140 of the housing 1110 in FIG. 19 and replaces them with the hub 1160 and struts 1165 of the interconnect substrate 1155 in FIG. 20, can provide several distinct advantages. For example, while the electric motor (not shown) in the embodiment shown in FIG. 19 is mounted to an interconnect substrate (not shown) that is positioned between the hub 1135 and the electric motor, the electric motor in FIG. 20 mounts directly to the hub 1160. Accordingly, a thickness (measured axially through the duct region 1170) of the hub 1160 defined by the interconnect substrate 1155 in FIGS. 20 and 21 is understood to be less than a combined thickness of the housing hub 1135 and interconnect in an embodiment as shown in FIG. 19. As a result of the decreased thickness of the hub 1160 in FIG. 20, the air foils 1122 of the rotor 1120 shown in FIG. 21 can be deeper axially (e.g., can have an increased angle-of-attack) than a rotor compatible with the embodiment shown in FIG. 19 because the motor, which drives the rotor 1120 can sit deeper into the duct 1170 in FIG. 21 than in the duct 1115 shown in FIG. 19. Consequently, a fan embodiment as in FIGS. 20 and 21 that substitutes the hub-and-struts 1135, 1140 of the housing 1110 with a hub-and-strut interconnect 1155, 1160, 1165 can move more air at a given rotational speed than an embodiment that relies on the housing 1100 to provide the hub-and-struts 1135, 1140 like in FIG. 19. Alternatively, a fan rotor (and its airfoils) compatible with the embodiment in FIG. 19 can be retained and the overall fan thickness can be reduced by approximately the same amount as the thickness saved by eliminating the housing's 1100 hub-and-struts 1135, 1140.

As another advantage, lighting elements or other electrical elements 1180 (e.g., sensors) can be mounted along the struts 1165 of an interconnect substrate 1155, as shown in FIG. 20. For example, the interconnect substrate 1155 can define one or more electrical tracks connecting a microcontroller on the substrate 1155 with each of the one or more electrical elements 1180, which may include controllable accessories/devices (e.g., LED lights) and/or sensors (e.g., thermistors, thermocouples, pressure transducers, etc.). Further, the electrical tracks defined by the interconnect substrate 1155 can provide the segment of the logic bus that extends from the first edge connector 951 to the second edge connector 952.

A rotor 1120 as in FIG. 21 can define an axis-of-rotation co-centrically aligned with a longitudinal axis defined by the housing duct 1170. The rotor 1120 can include a hub 1121 and a plurality of airfoils 1122, with each airfoil 1122 extending radially outward from the hub. An outer circumference defined by the rotor 1120 as it rotates can be referred to as an outer circumference-of-rotation. In FIG. 21, the rotor 1120 includes a hoop 1123 extending circumferentially around the tips of the airfoils 1122. An outer surface of the hoop 1123 faces an internal surface of the housing duct 1170 (FIG. 20).

The interconnect substrate 1155 can be a first interconnect substrate and, although not shown in FIG. 20, the fan 1150 can have a second interconnect substrate. For instance, the second interconnect substrate can coincide with or be mounted to an outer wall 1185 of the fan housing, and can further be electrically coupled with the first interconnect substrate 1155. An illuminable element (e.g., an LED element) or other accessory can be mounted to the second interconnect substrate. As the second interconnect substrate can be electrically coupled through one or more electrical connections with the first interconnect substrate 1155, accessories mounted to the second interconnect substrate can be controlled by a microcontroller mounted to the first interconnect substrate 1155.

Figure 22:
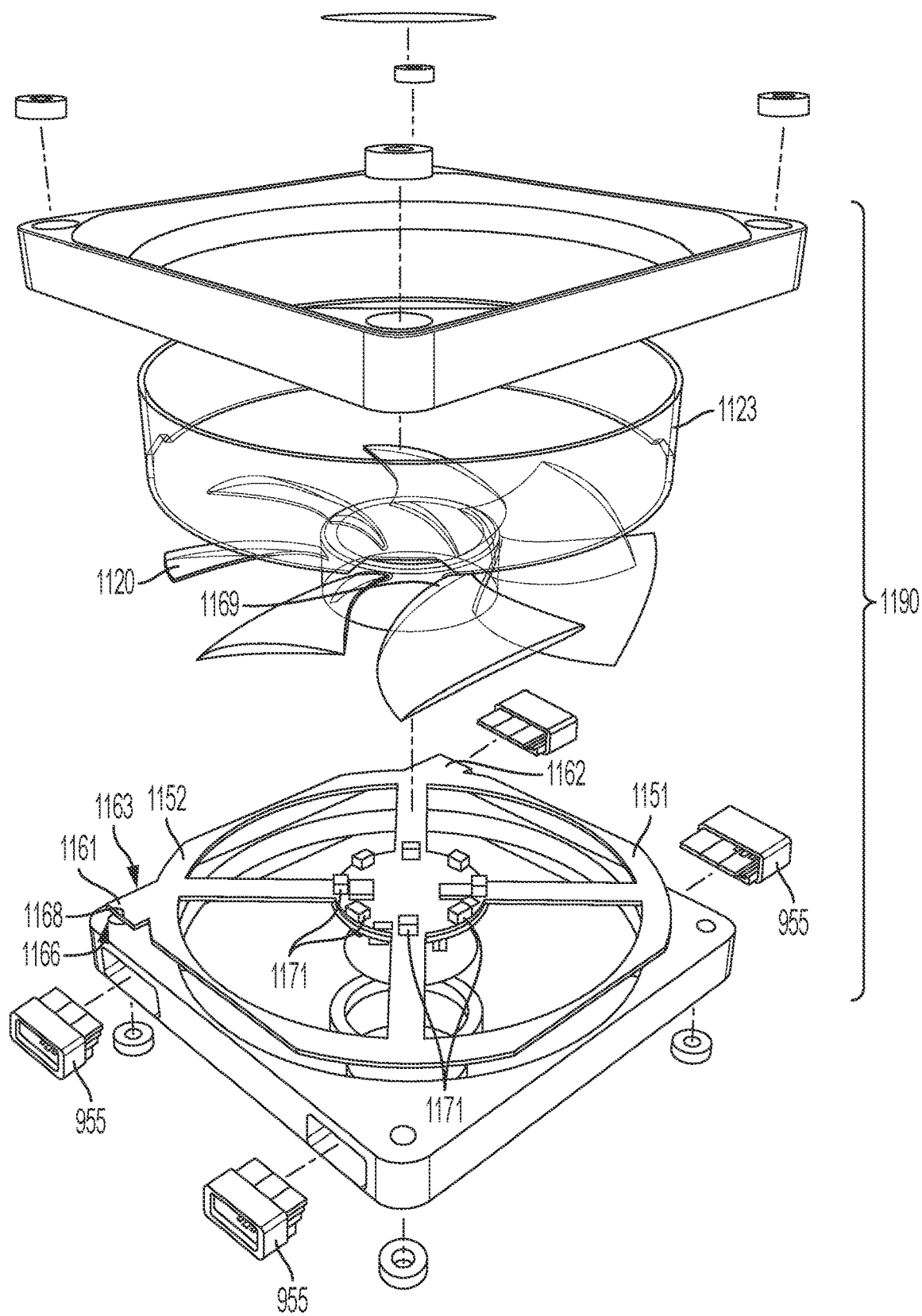
FIG. 22 shows an exploded view of another embodiment of a fan.

Referring now to FIG. 22, a further improved embodiment is described. As with the embodiment shown in FIG. 20, the embodiment shown in FIG. 22 eliminates the hub 1135 and struts 1140 defined by the housing 1110 in FIG. 19 and replaces them with an innovative interconnect substrate 1151. However, unlike the interconnect substrate 1155 in FIGS. 20 and 21, the interconnect substrate 1151 in FIG. 22 defines a first tongue 1161, which in turn defines a first edge connector 1168, and a second tongue 1162, which defines a second edge connector 1169. Except for extending from the interconnect substrate 1151, the edge connectors 1168, 1169 are similar to the edge connector 905 shown in FIGS. 11A and 11B.

For instance, the interconnect substrate 1151 defines a major region 1152 from which a first tongue 1161 and a second tongue 1162 extends. Each tongue 1161, 1162 extends outward of the major region 1152 and defines a first major surface 1163 and a second major surface 1166 oriented opposite the corresponding first major surface. The first major surface 1163 and the second major surface 1166 of the first tongue 1161 can define a corresponding first edge connector 1168. Similarly, the first major surface and the second major surface of the second tongue 1162 can define a corresponding second edge connector 1169. The interconnect substrate 1151 can define a plurality of data tracks (not shown) that route the data lines from the first tongue 1161 to the second tongue 1162. As discussed above, each edge connector 1168, 1169 can be 180-degrees symmetric about a longitudinal axis (analogous to the axis 930 in FIGS. 11A and 11B), which provides the second major surface 1166 of each edge connector with the same pinout arrangement as on the first major surface 1163 of the respective edge connector.

In a system embodiment with a biscuit-connector that does not cross-link (or swap positions of) the data lines from one end of the connector 800 to the opposite end of the connector, the edge connector of the second tongue 1162 can swap the positions of the data lines (Da and db) compared to the edge connector of the first tongue 1161. For example, from left to right a pinout on the first major surface 1163 of the first tongue 1161 can be PWR, GND, Da, db, GND, PWR. To ensure that the data lines (Da, db) of the logic bus properly extend from one fan to an adjacent fan, the pinout of the other fan's edge connector on its second tongue 1162 (which mates with the first tongue 1161 on the first fan) should mirror the pinout of the edge connector on the first tongue. Continuing by way of example with the embodiment shown in FIG. 22, the pinout of the second tongue 1162 can be PWR, GND, db, Da, GND, PWR, which positions the pad of the first connector associated with Da directly opposite the pad of the second (e.g., mating) connector associated with Da. Likewise, this pinout on the second tongue 1162 positions the pad associated with db directly opposite the pad associated with db on the first tongue. Alternatively, in a system embodiment having a biscuit-connector 800 that cross-links the position of the Da and db pins on one end with the position of the Da and db pins on the opposite end, the pinout of the first tongue 1161 can be identical with the pinout of the second tongue 1162.

Figure 23:
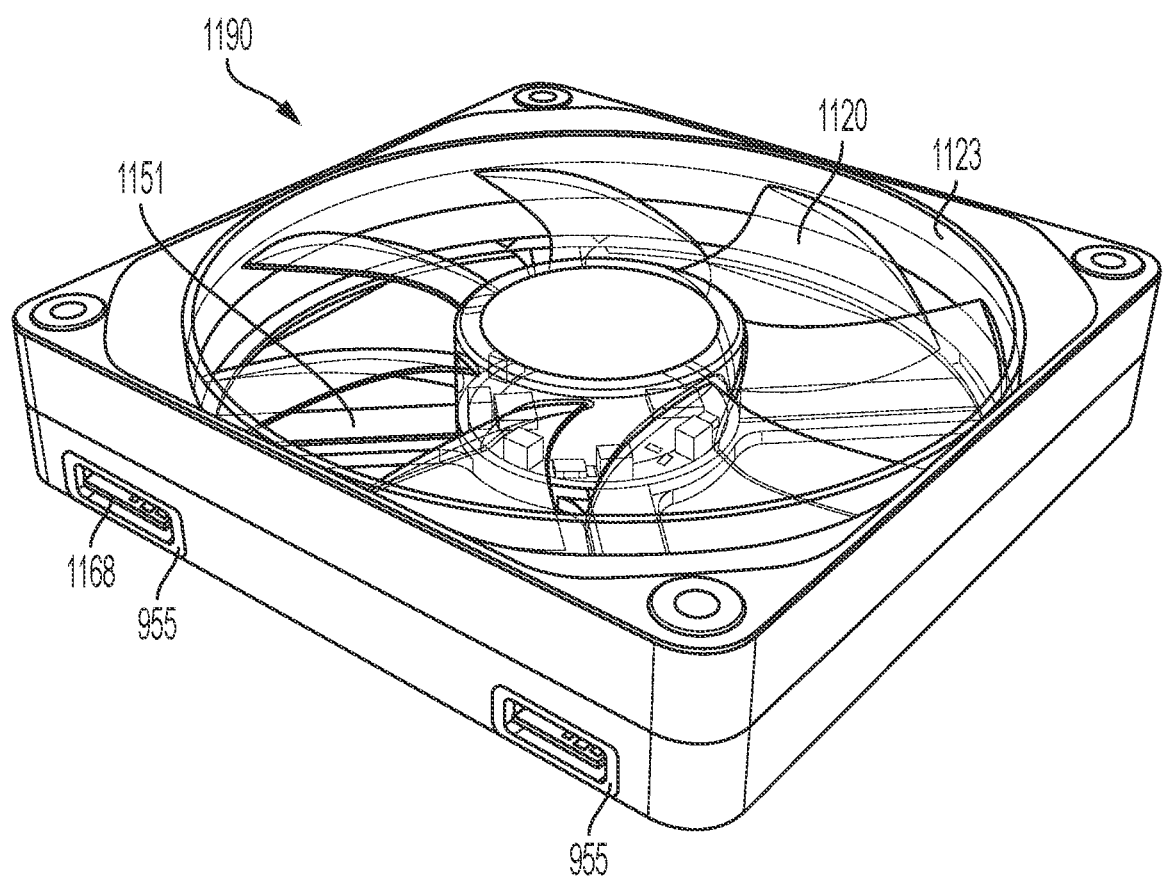
FIG. 23 shows an isometric view of the fan shown in FIG. 22.

In FIGS. 22 and 23, the socket housings 955 are rotated about 90-degrees relative to the fan-housing as compared to their orientation in FIGS. 19 and 20. Nonetheless, the socket housings 955 shown in FIG. 22 are similar to the socket housings described above in other embodiments.

With still a further alternate embodiment, the pinout of the first major surface 1163 on the first tongue 1161 (and the pinout of the second major surface 1166 on the first tongue 1161) can be symmetric about a longitudinal axis analogous to the axis 930 in FIGS. 11A and 11B. For example, such a pinout could be PWR, GND, Da, db, db, Da, GND, PWR. With such a symmetric pinout, there does not need to be cross-link of data-line positions from one tongue to the other tongue on a given fan (or a cross-link of data-line positions from one end of the biscuit-connector to the opposite end of the biscuit-connector).

As with the fan 1150 and interconnect 1155 shown in FIG. 20, lighting elements or other electrical elements 1180 (e.g., sensors) (see FIG. 20) can be mounted along the struts of the interconnect substrate 1151 shown in FIG. 22. And, as with the fan 1150 and motor mounted to the interconnect 1155, a motor 1171 can be mounted to the hub of the substrate 1151, providing similar benefits of a thinner housing and/or a steeper angle-of-attack by the airfoils for the fan 1190 as described above in relation to the fan 1150 shown in FIGS. 20 and 21.

V. Computing Environments

Figure 24:
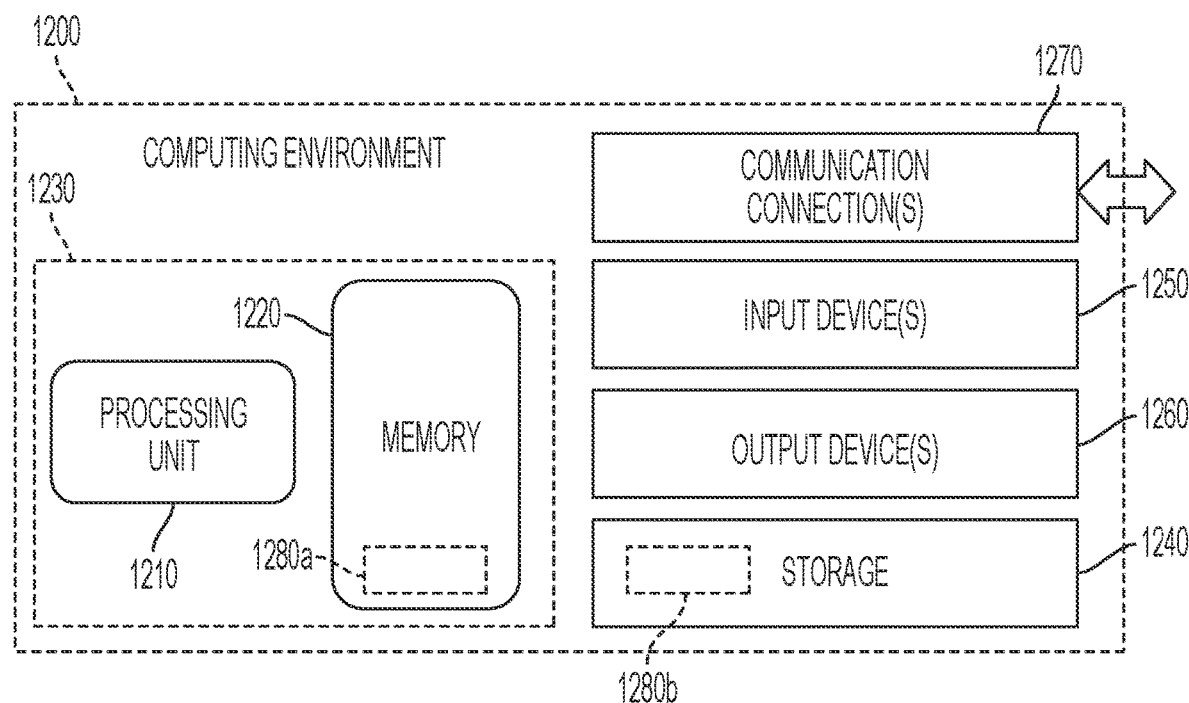
FIG. 24 shows a block diagram of a computing environment suitable for implementing disclosed methods.

FIG. 24 illustrates a generalized example of a suitable computing environment 1200 in which described methods, embodiments, techniques, and technologies relating, for example, to maintaining a temperature of a logic component and/or a power unit below a threshold temperature can be implemented. The computing environment 1200 is not intended to suggest any limitation as to scope of use or functionality of the technologies disclosed herein, as each technology may be implemented in diverse general-purpose or special-purpose computing environments. For example, each disclosed technology may be implemented with other computer system configurations, including wearable and/or handheld devices (e.g., a mobile-communications device), multiprocessor systems, microprocessor-based or programmable consumer electronics, embedded platforms, network computers, minicomputers, mainframe computers, smartphones, tablet computers, data centers, audio appliances, and the like. Each disclosed technology may also be practiced in distributed computing environments where tasks are performed by remote processing devices that are linked through a communications connection or network. In a distributed computing environment, program modules may be located in both local and remote memory storage devices.

The computing environment 1200 includes at least one central processing unit 1210 and a memory 1220. In FIG. 24, this most basic configuration 1230 is included within a dashed line. The central processing unit 1210 executes computer-executable instructions and may be a real or a virtual processor. In a multi-processing system, or in a multi-core central processing unit, multiple processing units execute computer-executable instructions (e.g., threads) to increase processing speed and as such, multiple processors can run simultaneously, despite the processing unit 1210 being represented by a single functional block. A processing unit can include an application specific integrated circuit (ASIC), a general purpose microprocessor, a field-programmable gate array (FPGA), a digital signal controller, or a set of hardware logic structures arranged to process instructions.

The memory 1220 may be volatile memory (e.g., registers, cache, RAM), non-volatile memory (e.g., ROM, EEPROM, flash memory, etc.), or some combination of the two. The memory 1220 stores software 180a that can, for example, implement one or more of the technologies described herein, when executed by a processor.

A computing environment may have additional features. For example, the computing environment 1200 includes storage 1240, one or more input devices 1250, one or more output devices 1260, and one or more communication connections 1270. An interconnection mechanism (not shown) such as a bus, a controller, or a network, interconnects the components of the computing environment 1200. Typically, operating system software (not shown) provides an operating environment for other software executing in the computing environment 1200, and coordinates activities of the components of the computing environment 1200.

The store 1240 may be removable or non-removable, and can include selected forms of machine-readable media. In general machine-readable media includes magnetic disks, magnetic tapes or cassettes, non-volatile solid-state memory, CD-ROMs, CD-RWs, DVDs, magnetic tape, optical data storage devices, and carrier waves, or any other machine-readable medium which can be used to store information and which can be accessed within the computing environment 1200. The storage 1240 can store instructions for the software 180b, which can implement technologies described herein.

The store 1240 can also be distributed over a network so that software instructions are stored and executed in a distributed fashion. In other embodiments, some of these operations might be performed by specific hardware components that contain hardwired logic. Those operations might alternatively be performed by any combination of programmed data processing components and fixed hardwired circuit components.

The input device(s) 1250 may be any one or more of the following: a touch input device, such as a keyboard, keypad, mouse, pen, touchscreen, touch pad, or trackball; a voice input device, such as a microphone transducer, speech-recognition software and processors; a scanning device; or another device, that provides input to the computing environment 1200. For audio, the input device(s) 1250 may include a microphone or other transducer (e.g., a sound card or similar device that accepts audio input in analog or digital form), or a computer-readable media reader that provides audio samples to the computing environment 1200.

The output device(s) 1260 may be any one or more of a display, printer, loudspeaker transducer, DVD-writer, or another device that provides output from the computing environment 1200.

The communication connection(s) 1270 enable communication over or through a communication medium (e.g., a connecting network) to another computing entity. A communication connection can include a transmitter and a receiver suitable for communicating over a local area network (LAN), a wide area network (WAN) connection, or both. LAN and WAN connections can be facilitated by a wired connection or a wireless connection. If a LAN or a WAN connection is wireless, the communication connection can include one or more antennas or antenna arrays. The communication medium conveys information such as computer-executable instructions, compressed graphics information, processed signal information (including processed audio signals), or other data in a modulated data signal. Examples of communication media for so-called wired connections include fiber-optic cables and copper wires. Communication media for wireless communications can include electromagnetic radiation within one or more selected frequency bands.

Machine-readable media are any available media that can be accessed within a computing environment 1200. By way of example, and not limitation, with the computing environment 1200, machine-readable media include memory 1220, storage 1240, communication media (not shown), and combinations of any of the above. Tangible machine-readable (or computer-readable) media exclude transitory signals.

As explained above, some disclosed principles can be embodied in a tangible, non-transitory machine-readable medium (such as microelectronic memory) having stored thereon instructions. The instructions can program one or more data processing components (generically referred to here as a "processor") to perform a processing operations described above, including estimating, computing, calculating, measuring, adjusting, sensing, measuring, filtering, addition, subtraction, inversion, comparisons, and decision making (such as by the control unit 52). In other embodiments, some of these operations (of a machine process) might be performed by specific electronic hardware components that contain hardwired logic (e.g., dedicated digital filter blocks). Those operations might alternatively be performed by any combination of programmed data processing components and fixed hardwired circuit components.

For sake of brevity throughout this disclosure, computing-environment components, processors, interconnections, features, devices, and media are generally referred to herein, individually, as a "logic component."

Disclosed logic hubs and logic components can be embodied in software, firmware or hardware (e.g., an ASIC). A control unit processor may be a special purpose processor such as an application specific integrated circuit (ASIC), a general purpose microprocessor, a field-programmable gate array (FPGA), a digital signal controller, or a set of hardware logic structures (e.g., filters, arithmetic logic units, and dedicated state machines), and can be implemented in a general computing environment as described herein. For instance, in an embodiment, a disclosed logic component comprises a processor and a memory containing instructions that, when executed by the processor, causes the logic component to receive an independently addressed data signal corresponding to each fan in the plurality of fans over a given data track of a logic bus and to transmit an independently addressed control signal to each fan over another second data track of the logic bus.

VI. Other Embodiments

The previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of electrical connectors, physical joinery, communication protocols and logic busses, and related methods and systems for fans and other networked accessories. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of embodiments that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

We currently claim:

1. A smart-fan apparatus comprising,
a fan rotor defining an axis-of-rotation and having a hub and a plurality of airfoils, each in the plurality of airfoils extending outward from the hub, the fan rotor defining an outer circumference-of-rotation;
an electric motor having a rotor configured to urge the fan rotor in rotation about the axis-of-rotation
a housing defining a duct region for receiving the fan rotor, the duct region being coaxially aligned with and extending longitudinally of the axis-of-rotation from a first face to a second face, wherein the rotor is positioned within the duct region and the duct region is so sized relative to the outer circumference-of-rotation as to define a gap between the fan rotor and the duct, wherein the housing further defines a sidewall extending longitudinally of the axis-of-rotation from the first face to the second face, the sidewall having an outer surface;
a connector port recessed from the outer surface of the sidewall, the connector port having an internal tongue defining a first major surface and an opposed second major surface, the tongue defining an edge connector having a first plurality of electrical contacts exposed on the first major surface and a second plurality of electrical contacts exposed on the second major surface, wherein the tongue further includes a plurality of electrically conductive tracks, each of the plurality of electrically conductive tracks being electrically coupled with one of the electrical contacts exposed on the first major surface and a corresponding one of the electrical contacts exposed on the second major surface;

control logic having a plurality of electrical connections; and a logic bus electrically coupling each of the plurality of electrical connections with at least one of the plurality of electrically conductive tracks, electrically coupling each of the plurality of electrical connections of the control logic with one of the electrical contacts exposed on the first major surface of the tongue and one of the electrical contacts exposed on the second major surface of the tongue, wherein the connector port defines a detent region, the smart-fan apparatus further comprising an electrical biscuit-connector, the electrical biscuit-connector comprising:

a housing enclosure extending from a first end to a second end, wherein the first end of the housing enclosure defines a first recessed opening, and the second end of the housing enclosure defines a second recessed opening, the housing enclosure further defining an external surface having a first detent region positioned proximate the first end and a second detent region positioned proximate the second end, each of the first detent region and the second detent region being configured to mechanically catch the detent region of the housing;

a first plurality of cantilevered arms arranged opposite a corresponding second plurality of cantilevered arms, wherein the first and second pluralities of cantilevered arms are positioned within the first recessed opening of the housing enclosure, wherein each of the cantilevered arms in the first plurality of cantilevered arms and the second plurality of cantilevered arms defines an electrical-contact region;

a third plurality of cantilevered arms arranged opposite a corresponding fourth plurality of cantilevered arms, the third and fourth pluralities of cantilevered arms positioned within the second recessed opening of the housing enclosure, wherein each of the cantilevered arms in the third plurality of cantilevered arms and the fourth plurality of cantilevered arms defines an electrical-contact region, wherein each of the cantilevered arms in the first plurality of cantilevered arms is electrically coupled with a corresponding one of the cantilevered arms in the third plurality of cantilevered arms and each of the cantilevered arms in the second plurality of cantilevered arms is electrically coupled with a corresponding one of the cantilevered arms in the fourth plurality of cantilevered arms, wherein the first plurality of cantilevered arms and the second plurality of cantilevered arms are configured to receive the tongue therebetween, wherein the first plurality of cantilevered arms and the second plurality of cantilevered arms electrically couple with, respectively, the first plurality of electrical contacts exposed on the first major surface of the tongue and the second plurality of electrical contacts exposed on the second major surface of the tongue, or vice versa, when and while the tongue is received between the first plurality of cantilevered arms and the second plurality of cantilevered arms.

2. The smart-fan apparatus according to claim 1, wherein each cantilevered arm in the first plurality of cantilevered arms is monolithic and continuous with the corresponding one of the cantilevered arms in the third plurality of cantilevered arms.

3. The smart-fan apparatus according to claim 2, wherein each cantilevered arm in the second plurality of cantilevered arms is monolithic and continuous with the corresponding one of the cantilevered arms in the fourth plurality of cantilevered arms.

4. The smart-fan apparatus according to claim 1, further comprising a first retainer configured to retain the first plurality of cantilevered arms in a fixed position relative to the third plurality of cantilevered arms.

5. The smart-fan apparatus according to claim 4, further comprising a second retainer configured to retain the second plurality of cantilevered arms in a fixed position relative to the fourth plurality of cantilevered arms.

6. The smart-fan apparatus according to claim 5, wherein the housing enclosure comprises a first shell and a second shell, wherein the first shell defines the first end, the first recessed opening, and the first detent region of the housing enclosure, wherein the second shell defines the second end, the second recessed opening, and the second detent region of the housing enclosure.

7. The smart-fan apparatus according to claim 6, wherein the first shell extends from the first end of the housing enclosure to a first intermediate end, wherein the second shell extends from the second end of the housing enclosure to a second intermediate end, wherein the first intermediate end and the second intermediate end are positioned adjacent each other.

8. The smart-fan apparatus according to claim 7, wherein the first intermediate end and the second intermediate end abut each other.

9. The smart-fan apparatus according to claim 7, wherein the first intermediate end and the second intermediate end matingly engage with each other or are fused together.

10. The smart-fan apparatus according to claim 6, wherein the first recessed opening defines a first interior wall and a second interior wall, wherein the first recessed opening is so sized relative to the first plurality of cantilevered arms and the second plurality of cantilevered arms as to define, when the biscuit-connector is disengaged from an edge connector of an interconnect substrate, a first gap between each of the first plurality of cantilevered arms and the first interior wall and a second gap between each of the second plurality of cantilevered arms and the second interior wall, and, when the biscuit-connector is engaged with an edge connector of an interconnect substrate, to cause the first plurality of cantilevered arms to urge against the first interior wall and to cause the second plurality of cantilevered arms to urge against the second interior wall.

11. The smart-fan apparatus according to claim 6, wherein the first retainer and the second retainer are positioned opposite each other, positioning the first plurality of cantilevered arms opposite the second plurality of cantilevered arms.

12. The smart-fan apparatus according to claim 11, wherein the first shell extends around a first portion of the first retainer and a corresponding first portion of the second retainer, urging the first retainer and the second retainer together.

13. The smart-fan apparatus according to claim 12, wherein the second shell extends around a second portion of the first retainer and a corresponding second portion of the second retainer, urging the first retainer and the second retainer together.

14. A smart-fan apparatus, comprising:
- a fan rotor defining an axis-of-rotation and having a hub and a plurality of airfoils, each in the plurality of airfoils extending radially outward from the hub, the fan rotor defining an outer circumference-of-rotation;
- an electric motor having a rotor configured to urge the fan rotor in rotation about the axis-of-rotation
- a housing defining a duct region for receiving the fan rotor, the duct region being coaxially aligned with and extending longitudinally of the axis-of-rotation from a first face to a second face, wherein the rotor is positioned within the duct region and the duct region is so sized relative to the outer circumference-of-rotation as to define a gap between the fan rotor and the duct, wherein the housing further defines a sidewall extending longitudinally of the axis-of-rotation from the first face to the second face, the sidewall having an outer surface;
- a connector port recessed from the outer surface of the sidewall, the connector port having an internal tongue defining a first major surface and an opposed second major surface, the tongue defining an edge connector having a first plurality of electrical contacts exposed on the first major surface and a second plurality of electrical contacts exposed on the second major surface, wherein the tongue further includes a plurality of electrically conductive tracks, each of the plurality of electrically conductive tracks being electrically coupled with one of the electrical contacts exposed on the first major surface and a corresponding one of the electrical contacts exposed on the second major surface;
- control logic having a plurality of electrical connections; and
- a logic bus having a first transmission line and a second transmission line, wherein the first transmission line electrically is electrically coupled with a first one of the plurality of electrically conductive tracks and the second transmission line is electrically coupled with a second one of the plurality of electrically conductive tracks, electrically coupling each of the plurality of electrical connections of the control logic with one of the electrical contacts exposed on the first major surface of the tongue and one of the electrical contacts exposed on the second major surface of the tongue, wherein the control logic comprises a microcontroller and a drop connection to the microcontroller from the first transmission line, the second transmission line, or both.

15. The smart-fan apparatus according to claim 14, wherein the microcontroller comprises a processor and a memory containing instructions that when executed by the processor, cause the control logic to control a speed of the electric motor.

16. The smart-fan apparatus according to claim 14, wherein the connector port is a first connector port, the smart-fan apparatus further comprising a second a connector port recessed from the outer surface of the sidewall at a position opposite the first connector port relative to the fan rotor.

17. The smart-fan apparatus according to claim 16, wherein the second connector port comprises an internal tongue defining a first major surface and an opposed second major surface, the tongue defining an edge connector having a first plurality of electrical contacts exposed on the first major surface and a second plurality of electrical contacts exposed on the second major surface, wherein each of the exposed electrical contacts of the second connector port is electrically coupled to a corresponding one of the exposed electrical contacts of the first connector port.

18. The smart-fan apparatus according to claim 17, wherein the first transmission line electrically couples one of the electrical contacts of the second connector port with the corresponding one of the exposed electrical contacts of the first connector port, and the second transmission line electrically couples another one of the electrical contacts of the second connector port with the corresponding one of the exposed electrical contacts of the first connector port.

19. The smart-fan apparatus according to claim 14, wherein the microcontroller comprises an output connection electrically coupled with the motor for communicating a signal to the motor for controlling a speed of the motor.

20. The smart-fan apparatus according to claim 19, wherein the microcontroller is configured to output a pulse-width modulated signal over the output connection coupled with the motor.

21. The smart-fan apparatus according to claim 19, further comprising a controllable accessory, wherein the output connection is a first output connection, the microcontroller comprising a second output connection electrically coupled with the controllable accessory for communicating a signal to the controllable accessory for controlling operation of the controllable accessory.

22. The smart-fan apparatus according to claim 21, wherein the controllable accessory comprises accessory lighting having a plurality of illuminable-elements, wherein the microcontroller is configured to control one or more of illumination status, brightness, and color of each illuminable-element of the accessory lighting independently of each other illuminable-element of the accessory lighting.

23. A smart-fan apparatus, comprising:
- a fan rotor defining an axis-of-rotation and having a hub and a plurality of airfoils, each in the plurality of airfoils extending outward from the hub, the fan rotor defining an outer circumference-of-rotation;
- an electric motor having a rotor configured to urge the fan rotor in rotation about the axis-of-rotation
- a housing defining a duct region for receiving the fan rotor, the duct region being coaxially aligned with and extending longitudinally of the axis-of-rotation from a first face to a second face, wherein the rotor is positioned within the duct region and the duct region is so sized relative to the outer circumference-of-rotation as to define a gap between the fan rotor and the duct, wherein the housing further defines a sidewall extending longitudinally of the axis-of-rotation from the first face to the second face, the sidewall having an outer surface;
- a connector port recessed from the outer surface of the sidewall, the connector port having an internal tongue defining a first major surface and an opposed second major surface, the tongue defining an edge connector having a first plurality of electrical contacts exposed on the first major surface and a second plurality of electrical contacts exposed on the second major surface, wherein the tongue further includes a plurality of electrically conductive tracks, each of the plurality of electrically conductive tracks being electrically coupled with one of the electrical contacts exposed on the first major surface and a corresponding one of the electrical contacts exposed on the second major surface;

control logic having a plurality of electrical connections; and a logic bus electrically coupling each of the plurality of electrical connections with at least one of the plurality of electrically conductive tracks, electrically coupling each of the plurality of electrical connections of the control logic with one of the electrical contacts exposed on the first major surface of the tongue and one of the electrical contacts exposed on the second major surface of the tongue, wherein the fan rotor is a first fan rotor, the electric motor is a first electric motor, the housing is a first housing, and the connector port is a first connector port, wherein the smart-fan apparatus further comprises:

a second fan rotor having a hub and a plurality of airfoils;

a second electric motor configured to urge the second fan rotor in rotation;

a second housing, wherein the second fan rotor is rotatably coupled within the second housing, the second housing defining a sidewall having an outer surface;

a second connector port recessed from the outer surface of the second housing's sidewall, the second connector port having an internal tongue defining a first major surface and an opposed second major surface, the tongue defining an edge connector having a first plurality of electrical contacts exposed on the first major surface and a second plurality of electrical contacts exposed on the second major surface; and a biscuit-connector having a first end defining an outer contour complementary with the recess of the first connector port and a plurality of internal connector pins complementarily arranged relative to the exposed contacts of the first connector port so as to urge against the exposed contacts of the first connector port when the first end of the biscuit-connector matingly engages with the first connector port, the biscuit-connector further having a second end defining an outer contour complementary with the recess of the second connector port and a plurality of internal connector pins complementarily arranged relative to the exposed contacts of the second biscuit-connector port so as to urge against the exposed contacts of the second connector port when the second end of the biscuit-connector matingly engages with the second connector port.

24. The smart-fan apparatus according to claim 23, wherein the first end of the biscuit-connector is matingly engaged with the first connector port and the second end of the biscuit-connector is matingly engaged with the second connector port, the smart-fan apparatus further comprising a first detent for retaining the first end of the biscuit-connector in the first connector port and a second detent for retaining the second end of the biscuit-connector in the second connector port.

25. The smart-fan apparatus according to claim 24, wherein, when the biscuit-connector is matingly engaged with the first connector port and the second connector port, the sidewall of the first housing mates with the sidewall of the second housing.

26. The smart-fan apparatus according to claim 23, wherein the control logic is a first control logic, the smart-fan apparatus further comprising a second control logic having a second plurality of electrical connections, each electrically coupled with one of the first plurality of electrical contacts and a corresponding one of the second plurality of electrical contacts of the second connector port.

* * * * *